(12) United States Patent
Kim et al.

(10) Patent No.: US 11,610,938 B2
(45) Date of Patent: Mar. 21, 2023

(54) DISPLAY PANEL AND DISPLAY DEVICE INCLUDING THE SAME

(71) Applicant: Samsung Display Co., Ltd., Yongin-si (KR)

(72) Inventors: Jin Taek Kim, Yongin-si (KR); Jin Yeong Kim, Yongin-si (KR); Soo Hyun Moon, Yongin-si (KR); Sang Ho Park, Yongin-si (KR); Seung Min Lee, Yongin-si (KR); Jin Woo Lee, Yongin-si (KR); Tae Hoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 148 days.

(21) Appl. No.: 17/023,068

(22) Filed: Sep. 16, 2020

(65) Prior Publication Data

US 2021/0134877 A1 May 6, 2021

(30) Foreign Application Priority Data

Nov. 4, 2019 (KR) .......................... 10-2019-0139761

(51) Int. Cl.
*H01L 27/15* (2006.01)
*H01L 33/62* (2010.01)
(Continued)

(52) U.S. Cl.
CPC ............ *H01L 27/156* (2013.01); *G09G 3/32* (2013.01); *H01L 33/06* (2013.01); *H01L 33/387* (2013.01);
(Continued)

(58) Field of Classification Search
CPC ..... H01L 27/156; H01L 33/06; H01L 33/387; H01L 33/62; H01L 25/0753; G09G 3/32;
(Continued)

(56) References Cited

U.S. PATENT DOCUMENTS

| 10,026,777 B2 | 7/2018 | Kang et al. |
| 2019/0198589 A1 | 6/2019 | Choi et al. |

(Continued)

FOREIGN PATENT DOCUMENTS

| KR | 10-2016-0012876 A | 2/2016 |
| KR | 10-2018-0071465 A | 6/2018 |

(Continued)

*Primary Examiner* — Latanya N Crawford Eason
(74) *Attorney, Agent, or Firm* — Lewis Roca Rothgerber Christie LLP

(57) ABSTRACT

A display panel includes a base layer having a display area and a non-display area including a pad area; a plurality of transistors on the base layer; a first protective layer covering the plurality of transistors; a conductive layer on the first protective layer; a second protective layer over the conductive layer; a first electrode and a second electrode on the second protective layer, the first and second electrodes being spaced from each other; a plurality of light emitting elements between the first electrode and the second electrode; a first contact electrode on the first electrode, the first contact electrode being in contact with one end portion of the light emitting element, and a second contact electrode on the second electrode, the second contact electrode being in contact with the other end portion of the at least one light emitting element; and a first pad in the pad area.

26 Claims, 26 Drawing Sheets

(51) Int. Cl.
  *H01L 33/06*    (2010.01)
  *G09G 3/32*     (2016.01)
  *H01L 33/38*    (2010.01)

(52) U.S. Cl.
  CPC ..... *H01L 33/62* (2013.01); *G09G 2310/0278* (2013.01)

(58) Field of Classification Search
  CPC ......... G09G 2310/0278; G09G 3/3266; G09G 3/3275
  See application file for complete search history.

(56)       References Cited

U.S. PATENT DOCUMENTS

2019/0198600 A1    6/2019  Son
2021/0273131 A1*   9/2021  Kang .................. H01L 25/0753

FOREIGN PATENT DOCUMENTS

KR    10-2019-0078955 A    7/2019
KR    10-2019-0079308 A    7/2019

* cited by examiner

FIG. 1
FIG. 2
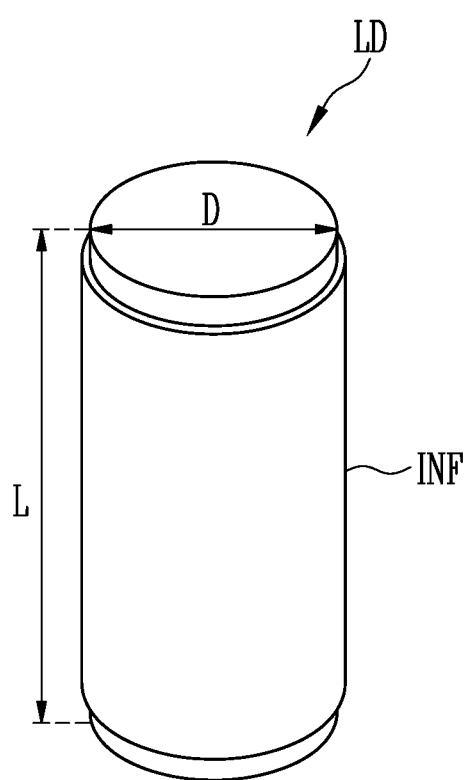
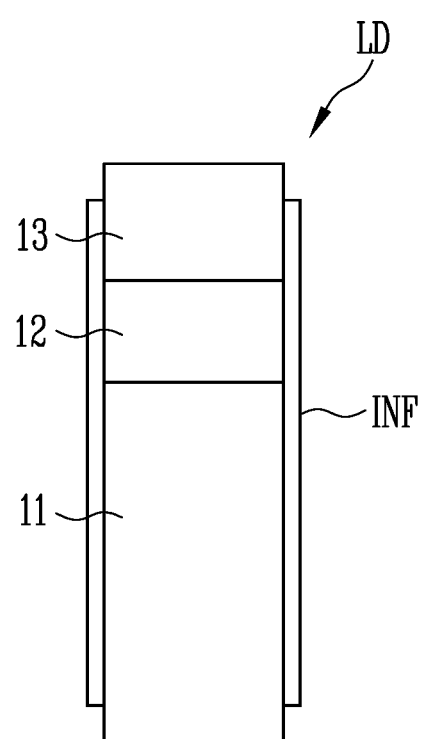

FIG. 3
FIG. 4
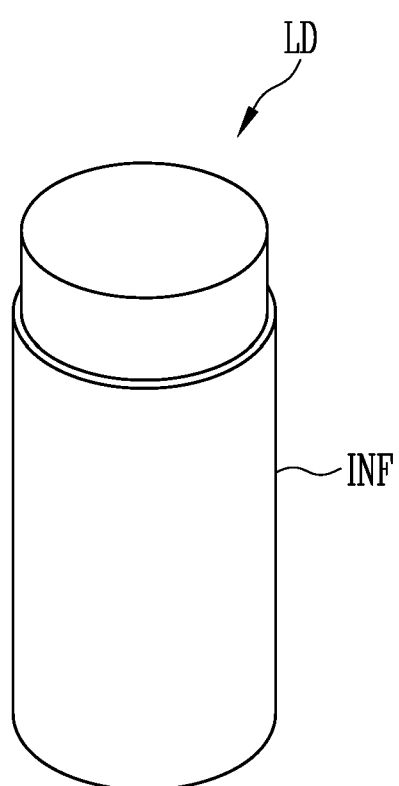
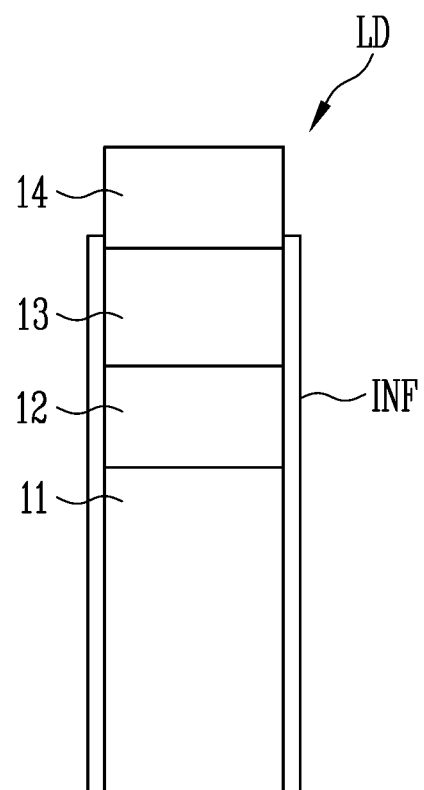

DISPLAY PANEL AND DISPLAY DEVICE INCLUDING THE SAME

CROSS-REFERENCE TO RELATED APPLICATION

This application claims priority to and the benefit of Korean patent application No. 10-2019-0139761 filed on Nov. 4, 2019 in the Korean Intellectual Property Office, the entire disclosure of which is incorporated herein by reference.

BACKGROUND

1. Field

The present disclosure generally relates to a display panel and a display device including the same.

2. Related Art

With the development of multimedia, display devices are becoming increasingly important. Accordingly, various types of display devices such as an organic light emitting display (e.g., an OLED display) device (OLED) and a liquid crystal display device (LCD) may be used for various purposes.

A display panel such as an organic light emitting display panel or a liquid crystal display panel may be included in a display device for displaying an image. The display panel may be a light emitting display panel and may include a light emitting element. The light emitting element may be a Light Emitting Diode (LED). Examples of an LED are an organic light emitting diode (OLED) using an organic material as a fluorescent material, an inorganic light emitting diode using an inorganic material as a fluorescent material, and the like.

The inorganic light emitting diode using an inorganic semiconductor as the fluorescent material may have durability even in a high temperature environment and may offer a high efficiency of blue light, as compared with the organic light emitting diode. In addition, a transferring method using a dielectrophoresis (DEP) technique has been developed in a manufacturing process which was pointed out as a limitation of the existing inorganic light emitting diodes. Accordingly, research for inorganic light emitting diodes having excellent durability and efficiency as compared with organic light emitting diodes has been continuously conducted. In addition, a transferring method using a DEP technique to address the limitation of the manufacturing process that was pointed out regarding existing inorganic light emitting diodes may be desirable.

SUMMARY

Example embodiments of the present disclosure provide a display device which includes a light emitting element of nano scales or micro scales, and is provided with a pad having a conductive layer including the same materials as an alignment electrode for aligning the light emitting element and a contact electrode for electrically connecting the alignment electrode and the light emitting element.

In accordance with an aspect of the present disclosure, there is provided a display panel including: a base layer having a display area and a non-display area, the non-display area including a pad area; a plurality of transistors on the base layer; a first protective layer covering the plurality of transistors; a conductive layer on the first protective layer; a second protective layer over the conductive layer; first and second electrodes on the second protective layer, the first and second electrodes being spaced from each other; a plurality of light emitting elements located between the first electrode and the second electrode; a first contact electrode on the first electrode, the first contact electrode being in contact with one end portion of at least one light emitting element from among the plurality of light emitting elements, and a second contact electrode on the second electrode, the second contact electrode being in contact with the other end portion of the at least one light emitting element; and a first pad in the pad area, the first pad having a plurality of conductive pad patterns, wherein a pad pattern at an uppermost portion of the first pad includes the same material as the first contact electrode or the second contact electrode.

The first pad may include: a first pad pattern; a second pad pattern on the first pad pattern; a third pad pattern on the second pad pattern; a fourth pad pattern on the third pad pattern; and a fifth pad pattern on the fourth pad pattern.

The fourth pad pattern may be the same material as the first electrode and the second electrode, and the fifth pad pattern may be the same material as the first contact electrode or the second contact electrode.

The first pad pattern may be the same material as a gate electrode of each of the transistors, the second pad pattern may be the same material as a source electrode and a drain electrode of each of the transistors, and the third pad pattern may be the same material as the conductive layer.

The conductive layer may include a connection pattern which electrically connects a source electrode or a drain electrode of a driving transistor from among the plurality of transistors to the first electrode or the second electrode.

The first pad pattern, the second pad pattern, the third pad pattern, the fourth pad pattern, and the fifth pad pattern may be electrically connected.

The second pad pattern and the fifth pad pattern may have the same width.

The first pad pattern, the third pad pattern, and the fourth pad pattern may have the same width.

The first pad may include a groove at an upper portion thereof, and a ratio of depth to width of the groove may be 20 or more.

The width of the groove may be 20 μm or more, and the depth of the groove may be 1 μm or less.

The pad pattern at the uppermost portion of the first pad may include ITO, IZO, or ITZO.

The first pad may be surrounded by adjacent insulating materials. A step difference between the first pad and the insulating materials may be 0.6 μm to 2.0 μm.

The display panel may further include a second pad in the pad area. The first pad may be a gate pad, and the second pad may be a data pad.

A scan signal may be applied to the first pad from the outside, and wherein the second pad is to receive a data signal from the outside.

The second pad may be adjacent to the first pad. A distance between the first pad and the second pad may be 15 μm to 25 μm.

The display panel may further include an insulating layer over the first pad. The insulating layer may include an area overlapping with an edge of the first pad.

The overlapping area may have a width of 2 μm to 3 μm.

The insulating layer may have a thickness of 6000 Å or less.

The display panel may further include an island electrode at the same layer as the first electrode and the second electrode. The island electrode may be between the first electrode and the second electrode.

Some of the plurality of light emitting elements may be located between the first electrode and the island electrode, and other ones of the light emitting elements may be located between the island electrode and the second electrode.

The plurality of light emitting elements may be connected in series and/or in parallel.

The first contact electrode may be on the second contact electrode.

Each of the light emitting elements may include: one end portion including an n-type semiconductor material; the other end portion including a p-type semiconductor material; and an active layer located in a quantum well structure between the one end portion and the other end portion. The light emitting element may have a diameter and a length in a range of a few hundreds of nano scales to a few micro scales.

In accordance with another aspect of the present disclosure, there is provided a display device including: a display panel having a plurality of pixels arranged therein; a scan driver configured to supply a scan signal to each of the plurality of pixels; and a data driver configured to supply a data signal to each of the plurality of pixels, wherein the display panel includes: a base layer having a display area and a non-display area, the non-display area including a pad area; a plurality of transistors on the base layer, the plurality of transistors being included in each of the pixels; a first protective layer covering the plurality of transistors; a conductive layer on the first protective layer; a second protective layer over the conductive layer; first and second electrodes on the second protective layer, the first and second electrodes being spaced from each other; a plurality of light emitting elements located between the first electrode and the second electrode; a first contact electrode on the first electrode, the first contact electrode being in contact with one end portion of at least one light emitting element from among the plurality of light emitting elements, and a second contact electrode on the second electrode, the second contact electrode being in contact with the other end portion of the at least one light emitting element; and first and second pads in the pad area, the first and second pads having a plurality of conductive pad patterns, wherein the first pad is electrically connected to the scan driver, wherein the second pad is electrically connected to the data driver, wherein a pad pattern at the uppermost portion of each of the first pad and the second pad includes the same material as the first contact electrode or the second contact electrode.

The scan driver and the data driver may be located outside of the display panel.

Each of the pixels may include seven transistors.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1 and 2 are perspective and sectional views illustrating a light emitting element in accordance with some example embodiments of the present disclosure.

FIGS. 3 and 4 are perspective and sectional views illustrating a light emitting element in accordance with some example embodiments of the present disclosure.

DETAILED DESCRIPTION

Figure 5:
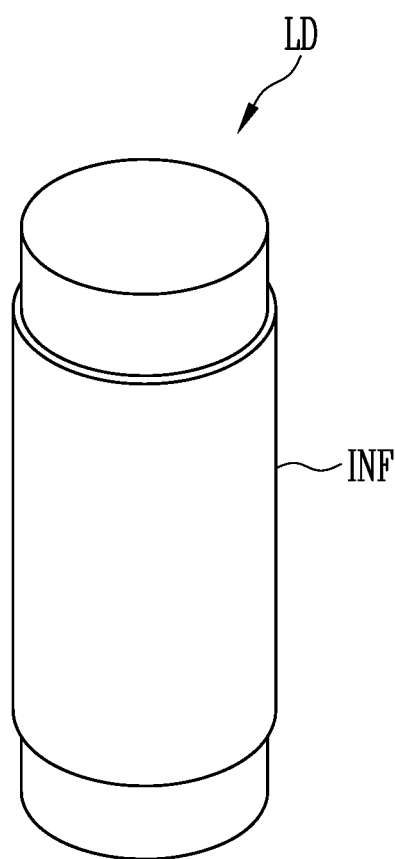
FIGS. 5 and 6 are perspective and sectional views illustrating a light emitting element in accordance with some example embodiments of the present disclosure.

The effects and characteristics of the present disclosure and a method of achieving the effects and characteristics will be clear by referring to the embodiments described below in detail together with the accompanying drawings. However, the present disclosure is not limited to the embodiments disclosed herein but may be implemented in various forms.

The embodiments are provided by way of example only so that a person of ordinary skilled in the art can fully understand the features in the present disclosure and the scope thereof. Therefore, the present disclosure can be defined by the scope of the appended claims.

The term "on" that is used to designate that an element or layer is on another element or layer includes both a case where an element or layer is located directly on another element or layer, and a case where an element or layer is located on another element or layer via still another element layer. In the entire description of the present disclosure, the same drawing reference numerals are used for the same elements across various figures.

Although the terms "first," "second," and the like are used for describing various components, these components are not confined by these terms. These terms are merely used for distinguishing one component from the other components. Therefore, a first component may be a second component or vice versa according to the technical concepts of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, example embodiments will be described with reference to the accompanying drawings. Throughout the drawings, the same reference numerals are given to the same elements.

FIGS. 1 and 2 are perspective and sectional views illustrating a light emitting element in accordance with an embodiment of the present disclosure. Although a bar-type light emitting element LD having a cylindrical shape is illustrated in FIGS. 1 and 2, but the type and/or shape of the light emitting element in accordance with the present disclosure are not limited thereto.

Referring to FIGS. 1 and 2, the light emitting element LD may include a first conductive electrode layer 11, a second conductive electrode layer 13, and an active layer 12 interposed between the first and second conductive electrode layers 11 and 13. In an example, the light emitting element LD may be configured as a stack structure in which the first conductive electrode layer 11, the active layer 12, and the second conductive electrode layer 13 are sequentially stacked along one direction.

In some embodiments, the light emitting element LD may be provided in a bar shape extending along one direction. The light emitting element LD may have one end portion and the other end portion along the one direction.

In some embodiments, one of the first and second conductive electrode layers 11 and 13 may be disposed at the one end portion of the light emitting element LD, and the other one of the first and second conductive electrode layers 11 and 13 may be disposed at the other end portion of the light emitting element LD.

In some embodiments, the light emitting element LD may be a bar-type light emitting diode manufactured in a bar shape. The bar shape may include a rod-like shape or a bar-like shape, which is long in its length direction (i.e., its aspect ratio is greater than 1), such as a cylinder or a polyprism, and the shape of a section of the bar shape is not particularly limited. For example, a length L of the light emitting element LD may be greater than a diameter D (or a width of a cross-section) of the light emitting element LD.

In some embodiments, the light emitting element LD may have a diameter D and/or a length L with a small size to a degree of micro or nano scales, e.g., in a range of a few hundreds of nano scales to a few micro scales. However, the size of the light emitting element LD is not limited thereto. For example, the size of the light emitting element LD may be variously changed depending on design conditions of various types of devices, e.g. a display device and the like, which use, as a light emitting unit, a lighting device using the light emitting element LD.

The first conductive electrode layer 11 may include at least one n-type semiconductor material. For example, the first conductive electrode layer 11 may include one semiconductor material from among InAlGaN, GaN, AlGaN, InGaN, AlN, and InN, and may include an n-type semiconductor material doped with a first conductive dopant such as Si, Ge, or Sn. However, the material constituting the first conductive electrode layer 11 is not limited thereto. In addition, various materials may constitute the first conductive electrode layer 11.

The active layer 12 is located (e.g., formed) on the first conductive electrode layer 11, and may be formed in a single or multiple quantum well structure. In an embodiment, a clad layer (not shown) doped with a conductive dopant may be located (e.g., formed) on the top and/or the bottom of the active layer 12. In an example, the clad layer may be implemented as an AlGaN layer or an InAlGaN layer. In some embodiments, a material such as AlGaN or AlInGaN may be used to form the active layer 12. In addition, various materials may constitute the active layer 12.

When a voltage equal to or greater than a threshold voltage is applied to the both ends of the light emitting element LD, the light emitting element LD emits light as electron-hole pairs are combined in the active layer 12. The emission of the light emitting element LD may be controlled using such a principle, and therefore, the light emitting element LD may be used as a light emitting unit of various lighting devices including a pixel of a display device.

The second conductive electrode layer 13 is located (e.g., formed) on the active layer 12, and may include a semiconductor layer having a type different from that of the first conductive electrode layer 11. In an example, the second conductive electrode layer 13 may include at least one p-type semiconductor material. For example, the second conductive electrode layer 13 may include at least one semiconductor material from among InAlGaN, GaN, AlGaN, InGaN, AlN, and InN, and may include a p-type semiconductor material doped with a second conductive dopant such as Mg. However, the material constituting the second conductive electrode layer 13 is not limited thereto. In addition, various materials may constitute the second conductive electrode layer 13.

In some embodiments, the light emitting element LD may further include an insulative film INF on a surface thereof. For example, the insulative film INF may be on an outer surface of the light emitting element LD. The insulative film INF may be located (e.g., formed) on the surface of the light emitting element LD to surround the outer circumference of at least the active layer 12. In addition, the insulative film INF may further surround at least one area of the first and second conductive electrode layers 11 and 13. However, the insulative film INF may expose both end portions of the light emitting element LD, which have different polarities. For example, the insulative film INF may expose both the end portions of the light emitting element LD without covering at least one end of each of the first and second conductive electrode layers 11 and 13 located at both ends of the light emitting element LD in the length direction, e.g., two planes (i.e., an upper surface and a lower surface) of the cylinder. For example, in some embodiments, the insulative film INF may not cover the end portions of the light emitting element LD adjacent to the first and second conductive electrode layers 11 and 13.

In some embodiments, the insulative film INF may include at least one insulating material from among silicon dioxide ($SiO_2$), silicon nitride ($Si_3N_4$), aluminum oxide ($Al_2O_3$), and titanium dioxide ($TiO_2$), but the present disclosure is not limited thereto. That is, the material constituting the insulative film INF is not particularly limited, and the insulative film INF may be made of various insulating materials currently known in the art.

In some embodiments, the light emitting element LD may further include an additional component in addition to the first conductive electrode layer 11, the active layer 12, the second conductive electrode layer 13, and/or the insulative film INF. For example, the light emitting element LD may further include at least one of a fluorescent layer, an active layer, a semiconductor layer, and/or an electrode layer, which may be disposed at one end of the first conductive electrode layer 11, the active layer 12, and/or the second conductive electrode layer 13.

Figure 6:
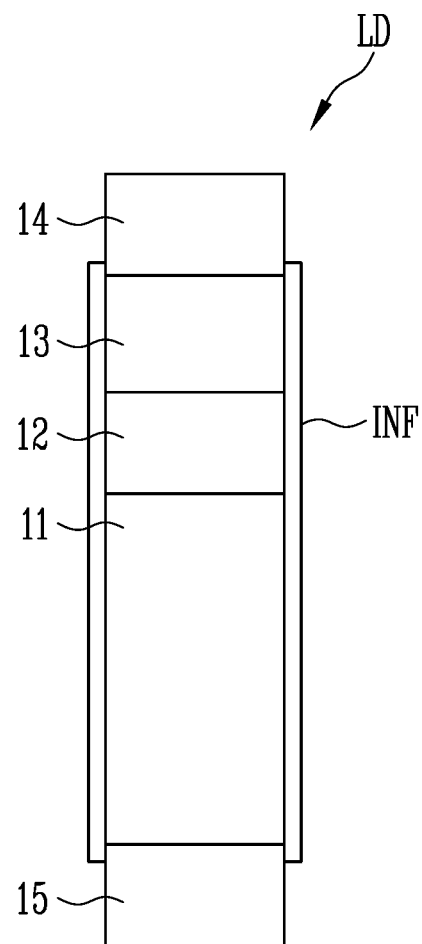

FIGS. 3 and 4 are perspective and sectional views illustrating a light emitting element in accordance with another example embodiment of the present disclosure. FIGS. 5 and 6 are perspective and sectional views illustrating a light emitting element in accordance with some example embodiments of the present disclosure.

Referring to FIGS. 3 and 4, the light emitting element LD may further include at least one electrode layer 14 at one end of the second conductive electrode layer 13.

Referring to FIGS. 5 and 6, the light emitting element LD may further include at least another electrode layer 15 at one end of the first conductive electrode layer 11.

Each of the electrode layers 14 and 15 may be an ohmic contact electrode, but the present disclosure is not limited thereto. Also, each of the electrode layers 14 and 15 may include a metal or a conductive metal oxide. In an example, each of the electrode layers 14 and 15 may include one or mixture of chromium (Cr), titanium (Ti), aluminum (Al), gold (Au), nickel (Ni), ITO, oxide or alloy thereof, a transparent electrode material such as Indium Tin Oxide (ITO), Indium Zinc Oxide (IZO), Zinc Oxide (ZnO) or Indium Tin Zinc Oxide (ITZO), and the like. The electrode layers 14 and 15 may be substantially transparent or translucent. Accordingly, light generated in the light emitting element LD can be transmitted through the electrode layers 14 and 15 and then emitted to the outside of the light emitting element LD.

In some embodiments, the insulative film INF may at least partially surround or may not surround the outer circumference of the electrode layers 14 and 15. That is, the insulative layer INF may be selectively located (e.g., formed) on surfaces (e.g., side surfaces) of the electrode layers 14 and 15. Also, the insulative layer INF may be located (e.g., formed) at both ends of the light emitting element LD, which have different polarities. In some example embodiments, the insulative layer INF may expose at least one area of the electrode layers 14 and 15. However, the present disclosure is not limited thereto, and the insulative film INF may not be provided.

The insulative film INF is located on a surface of the light emitting element LD, e.g., a surface of the active layer 12, so that the active layer 12 may be prevented (or substantially prevented) from being short-circuited (or chances of short circuit may be reduced) with at least one electrode 14 or 15 (e.g., at least one of contact electrodes 14 or 15 connected to respective the ends of the light emitting element LD).

Accordingly, the electrical stability of the light emitting element LD may be substantially ensured. For example, the electrical stability of the of the light emitting element LD may be increased due to the decrease in the chances of the short circuit because of the insulation provided by the insulative film INF between the active layer 12 and the at least one electrode 14 or 15.

Further, the insulative film INF is located (e.g., formed) on the surface of the light emitting element LD, so that a surface defect of the light emitting element LD may be minimized or reduced, and the lifespan and efficiency of the light emitting element LD may be improved. Furthermore, the insulative film INF is located (e.g., formed) on the light emitting element LD, so that an unwanted short circuit may be prevented from occurring (or chances of short circuit may be reduced) between a plurality of light emitting elements LD, even when the plurality of light emitting elements LD are close to each other (or in close proximity with each other).

In an embodiment, the light emitting element LD may be manufactured through a surface treatment process (e.g., coating). For example, when a plurality of light emitting elements LD are mixed in a liquid solution (or solvent) to be supplied to each light emitting area (e.g., a light emitting area of each pixel), the light emitting elements LD is not unequally condensed in the solution but equally dispersed in the solution. The light emitting area is an area in which light is emitted by the light emitting elements LD, and may be distinguished from a non-light emitting area in which no light is emitted.

In some embodiments, the insulative film INF itself may be formed as a hydrophobic layer made of a hydrophobic material, or a hydrophobic layer made of a hydrophobic material may be additionally located (e.g., formed) on the insulative film INF. In some embodiments, the hydrophobic material may be a material containing fluorine to exhibit hydrophobicity. Also, in some embodiments, the hydrophobic material may be applied in the form of a self-assembled monolayer (SAM) to the light emitting elements LD. The hydrophobic material may include octadecyl trichlorosilane, fluoroalkyl trichlorosilane, perfluoroalkyl triepoxysilane, etc. Also, the hydrophobic material may be a commercialized material containing fluorine, such as Teflon™ or Cytop™, or a material corresponding thereto.

A lighting device including the light emitting element LD may be used in various types of devices that require a light emitting unit, including a display device. For example, at least one micro light emitting element LD, e.g., a plurality of micro light emitting elements LD each having a size of nano scales or micro scales may be in a pixel area of a display panel, and a light emitting unit of each pixel may be configured using the micro light emitting elements LD. However, in example embodiments of the present disclosure, the application field of the light emitting element LD is not limited to display devices. For example, the light emitting element LD may be used in other types of devices that require the light emitting unit, such as a lighting device.

Figure 7:
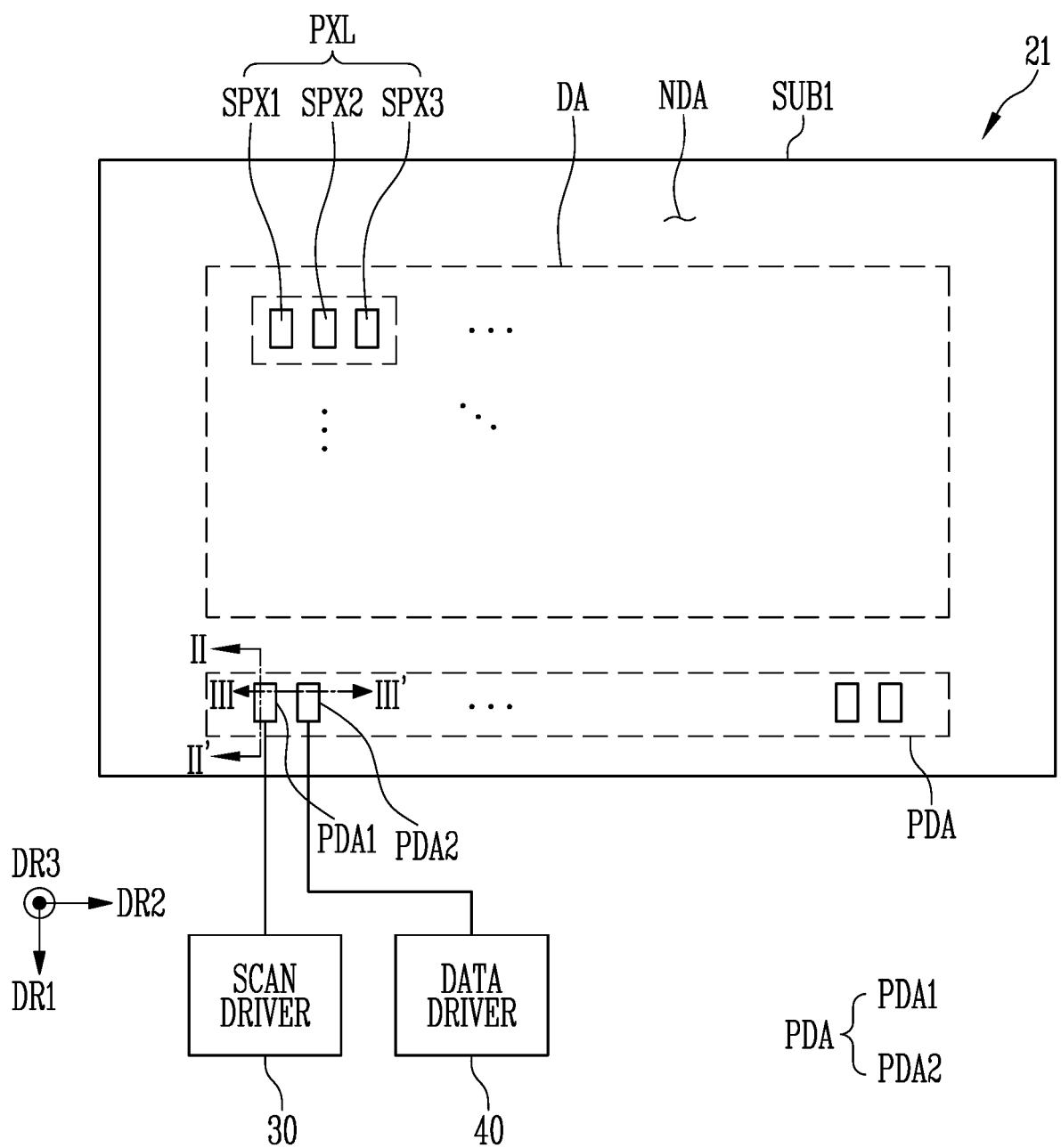
FIG. 7 is a conceptual view illustrating a display device in accordance with some example embodiments of the present disclosure.

FIG. 7 is a conceptual view illustrating a display device in accordance with an embodiment of the present disclosure. In some embodiments, a display device which can use the light emitting elements LD described with reference to FIGS. 1 to 6 as a light emitting unit is illustrated in FIG. 7. In some embodiments, a structure of the display device is briefly illustrated in FIG. 7, based on a display area DA. However, in some embodiments, at least one driving circuit (e.g., at least one of a scan driver and a data driver) and a plurality of lines, which are not shown, may be further disposed in the display device.

Referring to FIG. 7, the display device may include a display panel 21, a scan driver 30, and a data driver 40. In FIG. 7, the display panel 21 is illustrated as a schematic plan view, and the scan driver 30 and the data driver 40 are illustrated as a block diagram.

In an embodiment, the scan driver 30 and the data driver 40 may be located outside of (or external to) the display panel 21. Each of the scan driver 30 and the data driver 40 may be connected through a plurality of signal lines, but the present disclosure is not limited thereto. In another embodiment, the scan driver 30 and the data driver 40 may be located inside the display panel 21.

The display panel 21 may be provided in a rectangular shape which is longer in a second direction DR2 than in a first direction DR1. A thickness direction of the display panel 21 indicates a third direction DR3. However, directions indicated by the first to third directions DR1, DR2, and DR3 are relative concepts, and may be changed into other directions. Hereinafter, the first to third directions DR1, DR2, and DR3 are directions respectively indicated by the first to third directions DR1, DR2, and DR3, and are designated by like reference numerals. In addition, the shape of the display panel 21 is not limited to that shown in the drawing, and the display panel 21 may have various shapes. In addition, positions at which blocks representing concepts of the scan driver 30 and the data driver 40 are illustrated do not designate relative positions with respect to the display panel 21.

The display panel 21 may include a base layer SUB1 (or substrate) and pixels PXL disposed on the base substrate SUB1. Specifically, the display panel 21 and the base layer SUB1 may include the display area DA in which an image is displayed and a non-display area NDA (an area of the base layer SUB1 except for the display area DA).

The display area DA and the non-display area NDA may be defined in the base layer SUB1. In some embodiments, the display area DA may be located at in a central area of the display panel 21, and the non-display area NDA may be located along an edge of the display panel 21 to surround the display area DA. However, the positions of the display area DA and the non-display area NDA are not limited thereto, and may be changed.

The base layer SUB1 may constitute a base member of the display panel 21. For example, the base layer SUB may constitute a base member of a lower panel (e.g., a lower plate of the display panel 21).

In some embodiments, the base layer SUB1 may be a rigid substrate or a flexible substrate, and the material or property of the base layer SUB1 is not particularly limited. In an example, the base layer SUB1 may be a rigid substrate configured with glass or tempered glass, or a flexible substrate configured with a thin film made of a metallic material. Also, the base layer SUB1 may be a transparent substrate, but the present disclosure is not limited thereto. In an example, the base layer SUB1 may be a translucent substrate, an opaque substrate, or a reflective substrate.

An area on the base layer SUB1 is defined as the display area DA such that the pixels PXL are disposed therein, and the other area on the base layer SUB1 is defined as the non-display area NDA. In an example, the base layer SUB1 may include the display area DA including a plurality of light emitting areas in which the pixels PXL are located (e.g., formed) and the non-display area NDA located at the periphery of the display area DA. Various types of lines and/or a built-in circuit, connected to the pixels PXL of the display area DA, may be located in the non-display area NDA.

Each of the pixels PXL may include at least one light emitting element LD driven by a corresponding scan signal and a corresponding data signal, e.g., at least one bar-type light emitting diode in accordance with any one of the embodiments shown in FIGS. 1-6. For example, the pixel PXL may include a plurality of bar-type light emitting diodes which have a small size to a degree of nano scales or micro scales and are connected in parallel to each other. The plurality of bar-type light emitting diodes may constitute a light emitting unit of the pixel PXL.

Also, the pixel PXL may include a plurality of sub-pixels. In an example, the pixel PXL may include a first sub-pixel SPX1, a second sub-pixel SPX2, and a third sub-pixel SPX3. In some embodiments, the first, second, and third sub-pixels SPX1, SPX2, and SPX3 may emit light of different colors. In an example, the first sub-pixel SPX1 may be a red sub-pixel emitting light of red color, the second sub-pixel SPX2 may be a green sub-pixel emitting light of green color, and the third sub-pixel SPX3 may be a blue sub-pixel emitting light of blue color. However, the color, kind, and/or number of the sub-pixels constituting the pixel PXL are not particularly limited. In an example, the color of light emitted by each of the sub-pixels SPX1, SPX2, and SPX3, may be variously changed. Although an embodiment in which the pixels PXL are arranged in a stripe form in the display area DA is illustrated in FIG. 7, the present disclosure is not limited thereto. For example, the pixels PXL may be arranged in various pixel arrangement forms.

Figure 8:
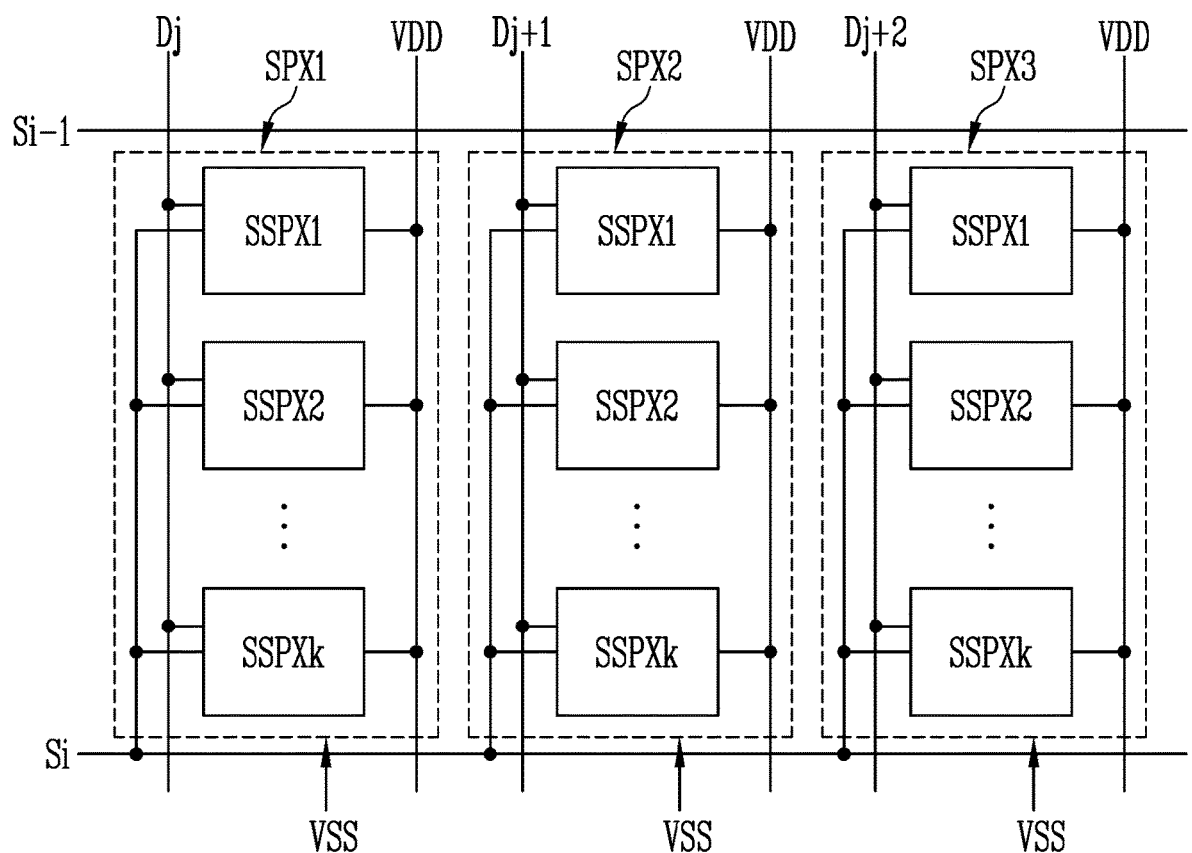
FIG. 8 is a circuit diagram illustrating an example of sub-pixels included in an example display panel shown in FIG. 7, according to some example embodiments of the present disclosure.

In an embodiment, the sub-pixels SPX1, SPX2, and SPX3 may include a plurality of unit pixels SSPX1, SSPX2, and SSPX3, respectively (as shown in FIG. 8).

The non-display area NDA may include a pad area PDA in which a plurality of pads PAD1 and PAD2 are arranged. That is, the pad area PDA may be further defined in the base layer SUB1.

In some embodiments, the pad area PDA may be located adjacent to one edge of the display area DA in the non-display area NDA. However, although the drawings illustrate a case where the pad area PDA is located adjacent to a lower edge of the display area DA, the disposition of the pad area PDA is not limited to that shown in the drawing. The pad area PDA may be located adjacent to an upper edge, a lower edge, a left edge, and/or a right edge of the display area DA in the non-display area NDA.

In an embodiment, the plurality of pads PAD1 and PAD2 may include a first pad PAD1 and a second pad PAD2. For example, the first pad PAD1 may be a gate pad, and the second pad PAD2 may be a data pad. The first pad PAD1 may be connected to the scan driver 30 located at the outside of the display panel 21. Therefore, a scan signal applied from the scan driver 30 may be transferred to a scan line through the first pad PAD1.

The second pad PAD2 may be connected to the data driver 40 located at the outside of the display panel 21. Therefore, a data signal applied from the data driver 40 may be transferred to a data line through the second pad PAD2.

FIG. 8 is a circuit diagram illustrating an example of the sub-pixels included in the display panel shown in FIG. 7. In FIG. 8, the first to third sub-pixels SPX1, SPX2, and SPX3 included in the display panel 21 shown in FIG. 7 are illustrated.

The first to third sub-pixels SPX1, SPX2, and SPX3 are identical to one another, except that the first to third sub-pixels SPX1, SPX2, and SPX3 are respectively connected to corresponding data lines Dj, Dj+1, and Dj+2, and therefore, the first sub-pixel SPX1 will be mainly described, including the first to third sub-pixels SPX1, SPX2, and SPX3.

The first to third sub-pixels SPX1, SPX2, and SPX3 may be respectively arranged in areas defined by scan lines Si−1 and Si (i is a natural number) and data lines Dj, Dj+1, and Dj+2 (j is a natural number). For example, the first sub-pixel SPX1 may be located in an area defined by (i−1)th and ith scan lines Si−1 and Si and jth and (j+1)th data lines Dj and Dj+1. However, the arrangement of the first to third sub-pixels SPX1, SPX2, and SPX3 is not limited thereto.

The first sub-pixel SPX1 may be connected to the scan line Si and the data line Dj, and may also be connected to a first power line and a second power line. A first power source VDD may be applied to the first power line, a second power source VSS may be applied to the second power line, and each of the first and second power lines may be a common line connected to a plurality of sub-pixels. The first and second power sources VDD and VSS may have different potentials such that the first sub-pixel SPX1 can emit light, and the first power source VDD may have a voltage level higher than that of the second power source VSS.

In some embodiments, the first sub-pixel SPX1 (or the second sub-pixel SPX2 or the third sub-pixel SPX3) may include at least one unit pixel SSPX1 to SSPXk (k is a natural number).

Each of the unit pixels SSPX1 to SSPXk may be connected to the scan line Si and the data line Dj, and may also be connected to the first power source VDD and the second power source VSS. Each of the unit pixels SSPX1 to SSPXk may emit light with a luminance corresponding to a data signal transmitted through the data line Dj in response to a scan signal transmitted through the scan line Si. The unit pixels SSPX1 to SSPXk may substantially have the same pixel structure or pixel circuit.

That is, the first sub-pixel SPX1 may include unit pixels SSPX1 to SSPXk which emit light independently from one another in response to one scan signal and one data signal.

In an embodiment, each of the unit pixels SSPX1 to SSPXk (or sub-pixels SPX1 to SPX3) may be configured as an active pixel. However, the kind, structure, and/or driving method of the unit pixel applicable to the display panel 21 of the present disclosure are not particularly limited. For example, the unit pixel may be configured as a pixel of the display panel 21, which has a passive or active structure currently known in the art.

FIGS. 9-12 are circuit diagrams illustrating an example applicable as the unit pixel included in the sub-pixel shown in FIG. 8.

One unit pixel will be mainly described for each drawing, and contents similar to those shown in FIG. 8 may be applied to first to kth unit pixels SSPX1 to SSPXk. Therefore, the similar contents will not be discussed in detail. That is, the first to kth unit pixels SSPX1 to SSPXk shown in FIG. 8 have structures substantially identical to or similar to one another. The first unit pixel SSPX1 shown in FIGS. 9-12 is merely illustrative, and may be identically or similarly applied to any one of the first to kth unit pixels SSPX1 to SSPXk.

Figure 9:
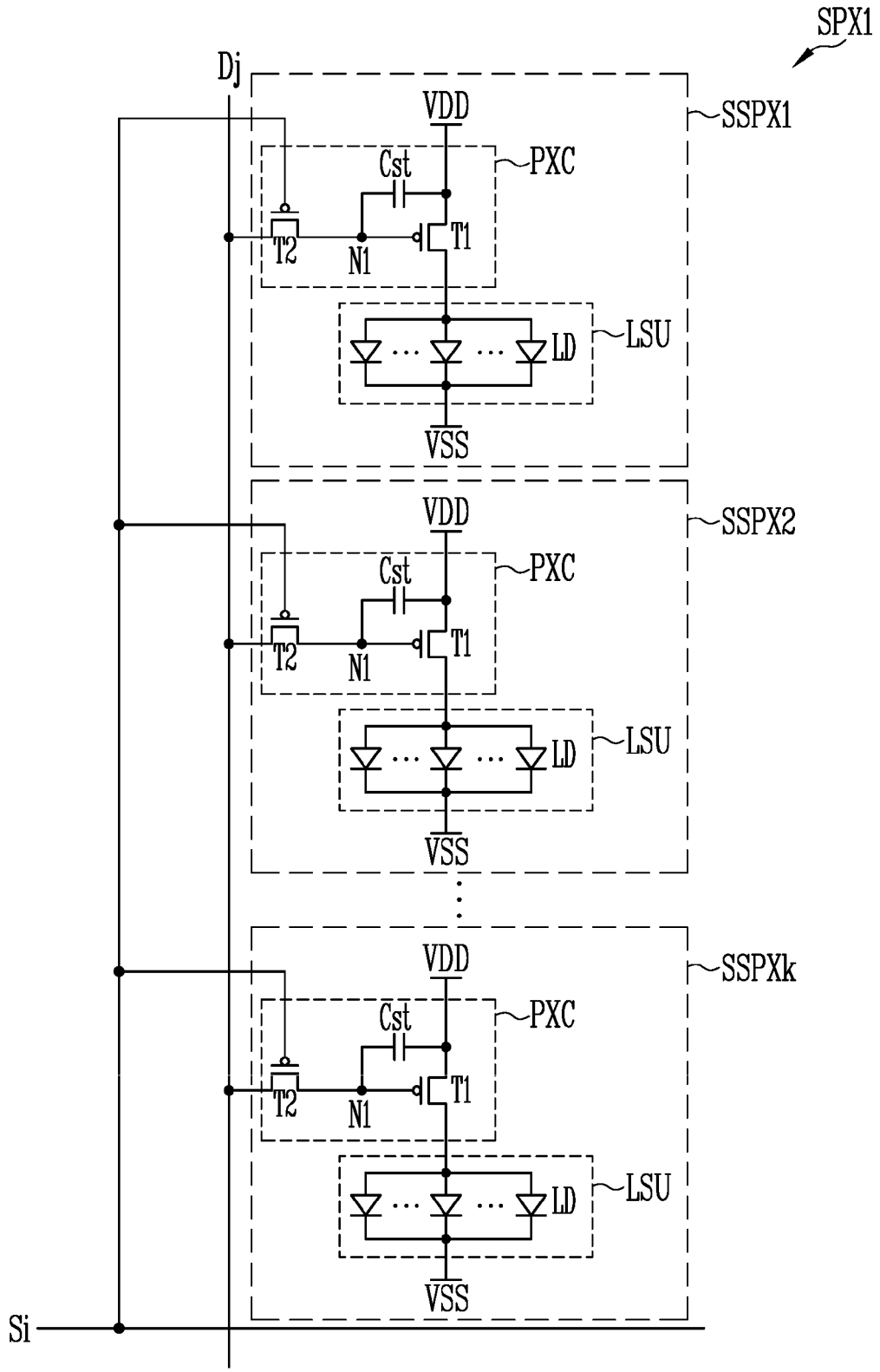
FIGS. 9-12 are circuit diagrams illustrating an example applicable as a unit pixel included in the sub-pixel shown in FIG. 8, according to some example embodiments of the present disclosure.

First, referring to FIG. 9, the unit pixel SSPX1 may include a light emitting unit LSU which emits light with a luminance corresponding to a data signal. Also, the unit pixel SSPX1 may selectively further include a pixel circuit for driving the light emitting unit LSU.

In some embodiments, the light emitting unit LSU may include a plurality of light emitting elements LD electrically connected between a first power source VDD and a second power source VSS. In an embodiment, the light emitting elements LD may be connected in parallel to each other, but the present disclosure is not limited thereto. For example, the plurality of light emitting elements LD may be connected in series to each other between the first power source VDD and the second power source VSS.

The first and second power sources VDD and VSS may have different potentials such that the light emitting elements LD can emit light. For example, the first power source VDD may be set as high-potential power source, and the second power source VSS may be set as a low-potential power source. A potential difference between the first and second power sources VDD and VSS may be set to a threshold voltage or more of the light emitting elements LD during a light emitting period of the first sub-pixel SPX1.

Meanwhile, although an embodiment in which the light emitting elements LD are connected in parallel to each other in the same direction (e.g., a forward direction) between the first power source VDD and the second power source VSS is illustrated in FIG. 9, the present disclosure is not limited thereto. In an example, some of the light emitting elements LD may be connected in the forward direction between the first and second power sources VDD and VSS to constitute each effective light emitting unit, and the other ones of the light emitting elements LD may be connected in a reverse direction. In another example, the unit pixel SSPX1 may include only a single light emitting element LD (e.g., a single effective light emitting unit connected in the forward direction between the first and second power sources VDD and VSS).

In some embodiments, one end portion of each of the light emitting elements LD may be commonly connected to a corresponding pixel circuit PXC through a first electrode, and may be connected to the first power source VDD through the pixel circuit PXC and a first power line. The other end portion of each of the light emitting elements LD may be commonly connected to the second power source VSS through a second electrode and a second power line.

The light emitting unit LSU may emit light with a luminance corresponding to a driving current supplied through the corresponding pixel circuit PXC. Accordingly, a set or predetermined image may be displayed in the display area DA (see FIG. 7).

The pixel circuit PXC may be connected to a scan line Si and a data line Dj, which correspond to a corresponding sub-pixel (i.e., the first sub-pixel SPX1). For example, when the first sub-pixel SPX1 is located on an ith row and a jth column of the display area DA, the pixel circuit PXC of the unit pixel SSPX may be connected to an ith scan line Si and a jth data line Dj of the display area DA.

The pixel circuit PXC may include first and second transistors T1 and T2 and a storage capacitor Cst.

The first transistor T1 (or driving transistor) may be connected between the first power source VDD and the light emitting unit LSU. A gate electrode of the first transistor T1 may be connected to a first node N1. The first transistor T1 may control a driving current supplied to the light emitting unit LSU, corresponding to a voltage of the first node N1.

The second transistor T2 (or switching transistor) may be connected between the data line Dj and the first node N1. A gate electrode of the second transistor T2 may be connected to the scan line Si.

The second transistor T2 may be turned on in response to a scan signal of a gate-on voltage (e.g., a low voltage) from the scan line Si, to electrically connect the data line Dj and the first node N1.

A data signal of a corresponding frame may be supplied to the data line Dj for each frame period. The data signal may be transferred to the first node N1 via the second transistor T2. Accordingly, the storage capacitor Cst may be charged to a voltage corresponding to the data signal.

One electrode of the storage capacitor Cst may be connected to the first power source VDD, and the other electrode of the storage capacitor Cst may be connected to the first node N1. The storage capacitor Cst may charge a voltage corresponding to the data signal supplied to the first node N1 during each frame period, and maintain the charged voltage until a data signal of a next frame is supplied.

Although a case where all the transistors, e.g., the first and second transistors T1 and T2 included in the pixel circuit PXC are P-type transistors is illustrated in FIG. 9, the present disclosure is not limited thereto. For example, at least one of the first and second transistors T1 and T2 may be an N-type transistor.

Figure 10:
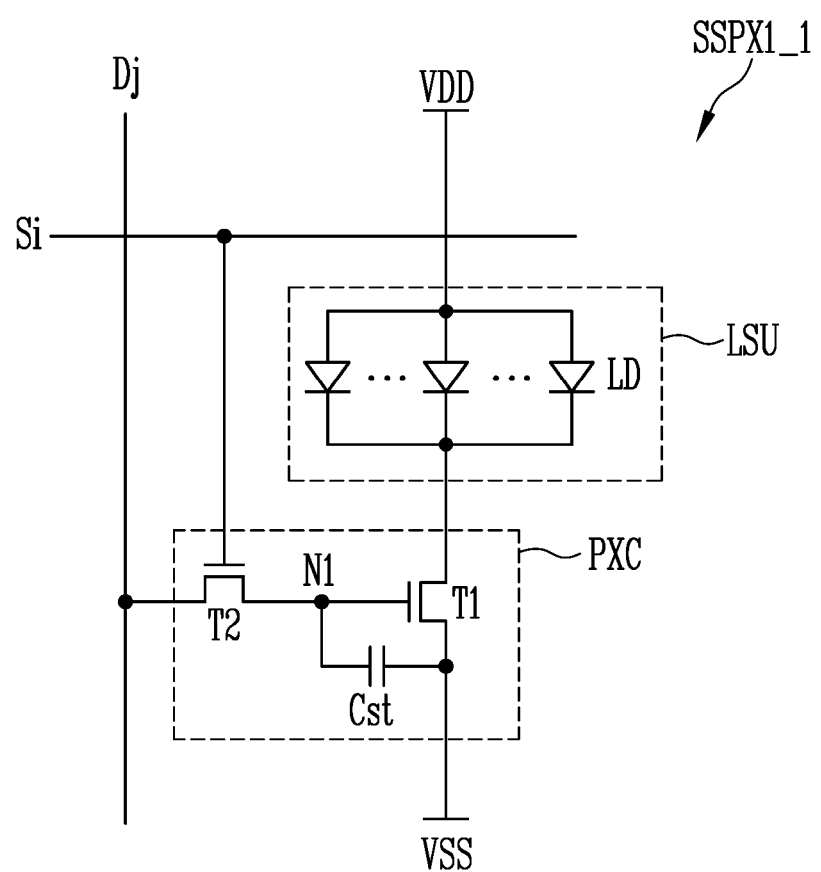

For example, as shown in FIG. 10, both the first and second transistors T1 and T2 may be N-type transistors. A gate-on voltage, for each frame period, to allow a data signal supplied to the data line Dj to be written to a unit pixel SSPX1_1, may be a high level voltage. Similarly, a voltage of a data signal for turning on the first transistor T1 may be that having a waveform opposite (e.g., may have voltages having opposite polarities) to that of the embodiment shown in FIG. 9. In an example, in the embodiment shown in FIG. 10, a data signal having a higher voltage level may be supplied as a grayscale value to be expressed becomes greater. In other words, in the embodiment of FIG. 10, the voltage level of the data signal increases as the gray level to be displayed by the pixel increases.

A configuration and an operation of the unit pixel SSPX1_1 shown in FIG. 10 are substantially similar to those of the unit pixel SSPX1 shown in FIG. 9, except that connection positions of some circuit elements and voltage levels of control signals (e.g., a scan signal and a data signal) are changed due to a change in transistor type. Therefore, a detailed description of the unit pixel SSPX1_1 shown in FIG. 10 will be omitted, as one of the ordinary skill in the art would be able to describe from the detailed description of FIG. 9.

Meanwhile, the structure of the pixel circuit PXC is not limited to the embodiments shown in FIGS. 9 and 10. That is, the pixel circuit PXC may be configured as a pixel circuit using various structures and/or various driving methods known to those skilled in the art. For example, the pixel circuit PXC may be configured as illustrated in the embodiment shown in FIG. 11.

Figure 11:
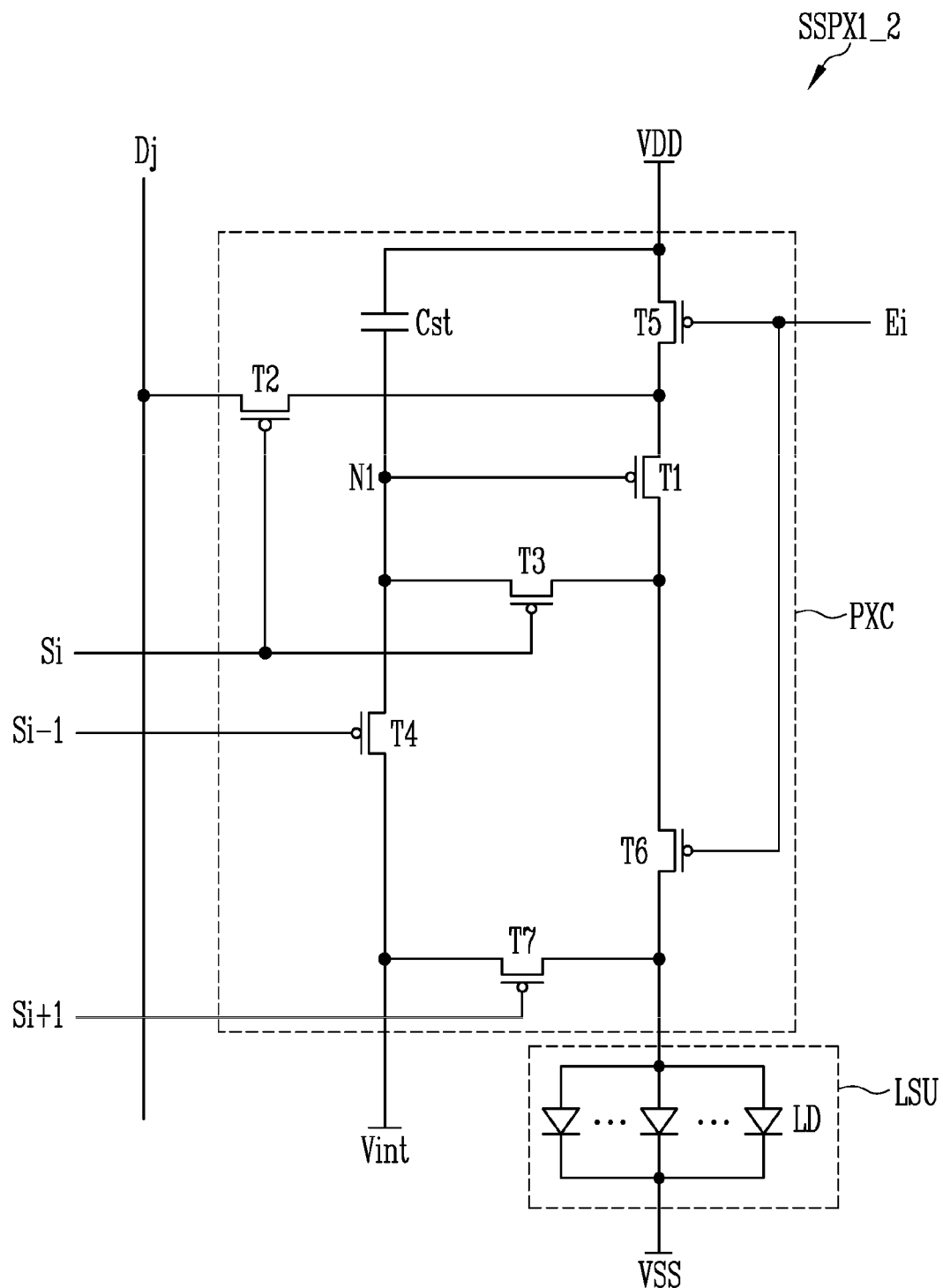

Referring to FIG. 11, a pixel circuit PXC in a unit pixel SSPX1_2 may be further connected to at least another scan line (or control line) in addition to a corresponding scan line Si. For example, a pixel circuit PXC of a sub-pixel SPX (or unit pixel included therein) located on the ith row of the display area DA, may be further connected to an (i−1)th scan line Si−1 and/or an (i+1)th scan line Si+1. Also, in some embodiments, the pixel circuit PXC may be further connected to another power source in addition to the first and second power sources VDD and VSS. For example, the pixel circuit PXC may also be connected to an initialization power source Vint.

In some embodiments, the pixel circuit PXC may include seven transistors T1 to T7. The pixel circuit PXC may include first to seventh transistors T1 to T7 and a storage capacitor Cst.

The first transistor T1 may be connected between the first power source VDD and a light emitting unit LSU. One electrode (e.g., a source electrode) of the first transistor T1 may be connected to the first power source VDD through the fifth transistor T5, and the other electrode (e.g., a drain electrode) of the first transistor T1 may be connected to one electrode of the light emitting unit LSU (e.g., a first electrode of the corresponding sub-pixel SPX) via the sixth transistor T6. A gate electrode of the first transistor T1 may be connected to a first node N1. The first transistor T1 may control a driving current supplied to the light emitting unit LSU, corresponding to a voltage of the first node N1.

The second transistor T2 may be connected between a data line Dj and the one electrode of the first transistor T1. A gate electrode of the second transistor T2 may be connected to the corresponding scan line Si. The second transistor T2 may be turned on when a scan signal of a gate-on voltage is supplied from the scan line Si, to electrically connect the data line Dj to the one electrode of the first transistor T1. Therefore, when the second transistor T2 is turned on, a data signal supplied from the data line Dj may be transferred to the first transistor T1.

The third transistor T3 may be connected between the other electrode (e.g., the drain electrode) of the first transistor T1 and the first node N1. A gate electrode of the third transistor T3 may be connected to the corresponding scan line Si. The third transistor T3 may be turned on when a scan signal of a gate-on voltage is supplied from the scan line Si, to allow the first transistor T1 to be diode-connected.

The fourth transistor T4 may be connected between the first node N1 and the initialization power source Vint. A gate electrode of the fourth transistor T4 may be connected to a previous scan line, e.g., the (i−1)th scan line. The fourth transistor T4 may be turned on when a scan signal of a gate-on voltage is supplied to the (i−1)th scan line Si−1, to transfer a voltage of the initialization power source Vint to the first node N1. The voltage of the initialization power source Vint may be equal to or smaller than the lowest voltage of the data signal.

The fifth transistor T5 may be connected between the first power source VDD and the first transistor T1. A gate electrode of the fifth transistor T5 may be connected to a corresponding emission control line, e.g., an ith emission control line Ei. The fifth transistor T5 may be turned off when an emission control signal of a gate-off voltage (e.g., a high voltage) is supplied to the emission control line Ei, and be turned on in other cases.

The sixth transistor T6 may be connected between the first transistor T1 and a first electrode of the light emitting unit LSU. A gate electrode of the sixth transistor T6 may be connected to the corresponding emission control line, e.g., the ith emission control line Ei. The sixth transistor T6 may be turned off when an emission control signal of a gate-off voltage is supplied to the emission control line Ei, and be turned on in other cases.

The seventh transistor T7 may be connected between the first electrode of the light emitting unit LSU and the initialization power source Vint (or a third power line for transmitting the initialization power source). A gate electrode of the seventh transistor T7 may be connected to any one of scan lines of a next stage, e.g., the (i+1)th scan line Si+1. The seventh transistor T7 may be turned on when a scan signal of a gate-on voltage is supplied to the (i+1)th scan line Si+1, to supply the voltage of the initialization power source Vint to one electrode of the light emitting unit LSU.

The storage capacitor Cst may be connected between the first power source VDD and the first node N1. The storage capacitor Cst may store a voltage corresponding to a data signal supplied to the first node and a threshold voltage of the first transistor T1 in each frame period.

Although a case where all the transistors, e.g., the first to seventh transistors T1 to T7 included in the pixel circuit PXC are P-type transistors is illustrated in FIG. 11, the present disclosure is not limited thereto. In an example, at least one of the first to seventh transistors T1 to T7 may be changed to an N-type transistor.

In some embodiments, the pixel circuit PXC may be further connected to another line in addition to the data line Dj.

Figure 12:
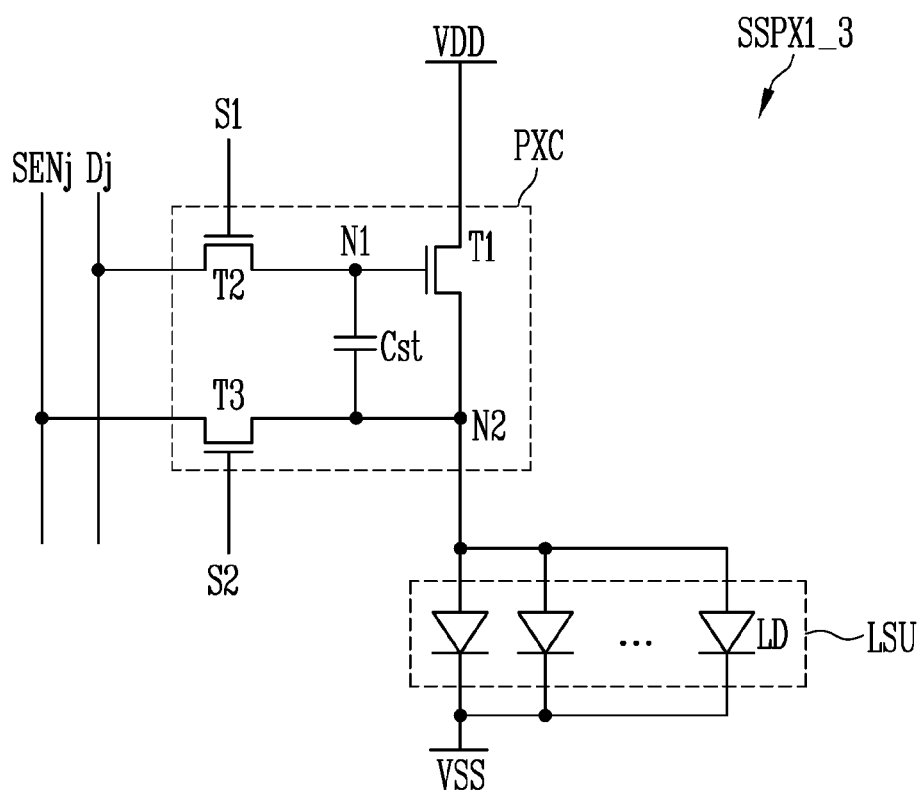

Referring to FIG. 12, a pixel circuit PXC in a unit pixel SSPX1_3 may be connected to a sensing line SENj. The pixel circuit PXC may include first to third transistors T1 to T3 and a storage capacitor Cst. The first and second transistors T1 and T2 and the storage capacitor Cst are substantially identical or similar to the first and second transistors T1 and T2 and the storage capacitor Cst, which are described with reference to FIG. 10, and therefore, overlapping descriptions will not be repeated.

The third transistor T3 may be connected between the sensing line SENj and a second node N2. A gate electrode of the third transistor T3 may be connected to a second scan line S2 (e.g., a (j+1)th scan line Sj+1 different from a jth scan line Sj) different from the first scan line S1.

A light emitting unit LSU may be connected between the second node N2 and a second power line (i.e., a power line to which the second power source VSS is applied).

The third transistor T3 may be turned on in response to a scan signal of a gate-on voltage, which is transmitted from the second scan line S2, to electrically connect the sensing line SENj and the second node N2.

For example, when the third transistor T3 is turned on in a state in which a driving current corresponding to a reference voltage flows through the first transistor T1, the driving current flowing through the first transistor T1 may be provided to an external sensing device through the third transistor T3 and the sensing line SENj, and a signal corresponding to a characteristic (e.g., Vth) of the first transistor T1 may be output to the outside through the sensing line SENj, based on the driving current.

In addition, the structure of the unit pixel SSPX1 applicable to the present disclosure is not limited to the embodiments shown in FIGS. 9-12, and the unit pixel SSPX1 may have various structures currently known in the art. For example, the pixel circuit PXC included in the unit pixel SSPX1 may be configured as a pixel circuit using various structures and/or various driving methods. Also, the unit pixel SSPX1 may be configured in a passive light emitting display panel, etc. In some embodiments, the pixel circuit PXC may be omitted, and each of the first and second electrodes of the light emitting unit LSU may be directly connected to a scan line Si, a data line Dj, a power line, and/or a control line.

Figure 13:
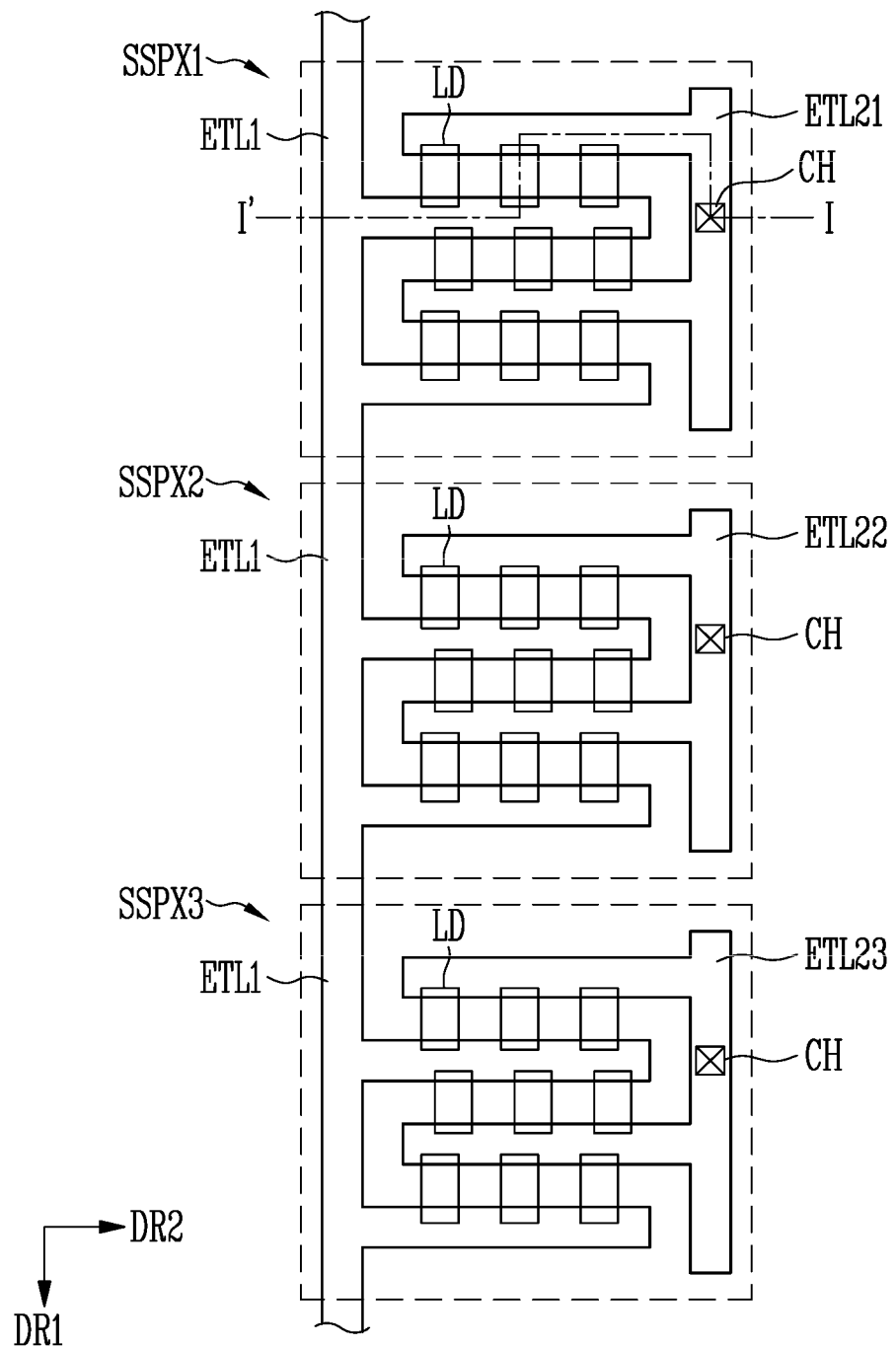
FIG. 13 is a plan layout view illustrating an example arrangement of some components in one sub-pixel included in the display panel shown in FIG. 7, according to some example embodiments of the present disclosure.

FIG. 13 is a plan layout view illustrating an arrangement of some components in one sub-pixel included in the display panel shown in FIG. 7. In FIG. 13, a structure of unit pixels SSPX1 to SSPX3 is illustrated based on a light emitting unit LSU (see FIGS. 9-12) (or a light emitting element layer) included in the unit pixels SSPX1 to SSPX3. First to third unit pixels SSPX1 to SSPX3 are substantially identical to one another, and therefore, the light emitting unit will be described based on the first unit pixel SSPX1.

Referring to FIG. 13, the first unit pixel SSPX1 may include a first electrode ETL1 and a second electrode ETL21 (or ETL22 in case of the second unit pixel SSPX2, or ETL23 in case of the third unit pixel SSPX3), which are spaced from each other, and at least one light emitting element LD connected between the first and the second electrodes ETL1 and ETL21 (or ETL22, or ETL23).

In some embodiments, light emitting elements LD included in the same unit pixel SSPX1 to SSPX3 may emit light of the same color. In some embodiments, the first to third unit pixels SSPX1 to SSPX3 may define light emitting areas which emit light of different colors. In an example, the first unit pixel SSPX1 may include light emitting elements LD which emit light of red color, the second unit pixel SSPX2 may include light emitting elements LD which emit light of green color, and the third unit pixel SSPX3 may include light emitting elements LD which emit light of blue color. In another example, the first to third unit pixels SSPX1 to SSPX3 may all include light emitting elements LD which emit light of blue color. In order to constitute a full-color pixel PXL, a light conversion layer and/or a color filter, which is used to convert the color of light emitted from a corresponding unit pixel, may be located on the top of at least some of the first to third unit pixels SSPX1 to SSPX3.

In some embodiments, the first electrode ETL1 may be an electrode shared by the first to third unit pixels SSPX1 to SSPX3. The first to third unit pixels SSPX1 to SSPX3 may be arranged along the first direction DR1.

The second electrodes ETL21, ETL22, and ETL23 of the first to third unit pixels SSPX1 to SSPX3 may be spaced from the first electrode ETL1 in the second direction DR2. The second electrodes ETL21, ETL22, and ETL23 in the first to third unit pixels SSPX1 to SSPX3 may be arranged in the first direction DR1.

The first and second electrodes ETL1, ETL21, ETL22, and ETL23 may be located side by side (in parallel) to be spaced from each other at a set or predetermined distance.

In some embodiments, the first electrode ETL1 may be a cathode electrode electrically connected to the second power source VSS. Each of the second electrodes ETL21, ETL22, and ETL23 may be an anode electrode electrically connected to the first power source VDD. Light emitting elements LD each having one end portion and the other end portion, which are electrically connected to the first electrode ETL1 and the second electrodes ETL21, ETL22, and ETL23, respectively, are located at the first electrode ETL1 and the second electrodes ETL21, ETL22, and ETL23, so that the first electrode ETL1 may be electrically connected to each of the second electrodes ETL21, ETL22, and ETL23, respectively.

In some embodiments, one light emitting area may be defined per one unit pixel (e.g., SSPX1). The light emitting area may be defined by a non-light emitting area. Although not clearly shown, a pixel defining layer (e.g., a bank or a light blocking pattern) for blocking light emitted from the light emitting element LD from being transmitted through another area, and the like may overlap with the non-light emitting area. In this specification, the term "overlapping" means that two components overlap with each other in a direction (e.g., the third direction D3) perpendicular to a surface (the base layer SUB1 in the drawing) in the thickness direction of the display panel 21 as long as any specific definition is not made.

Figure 14:
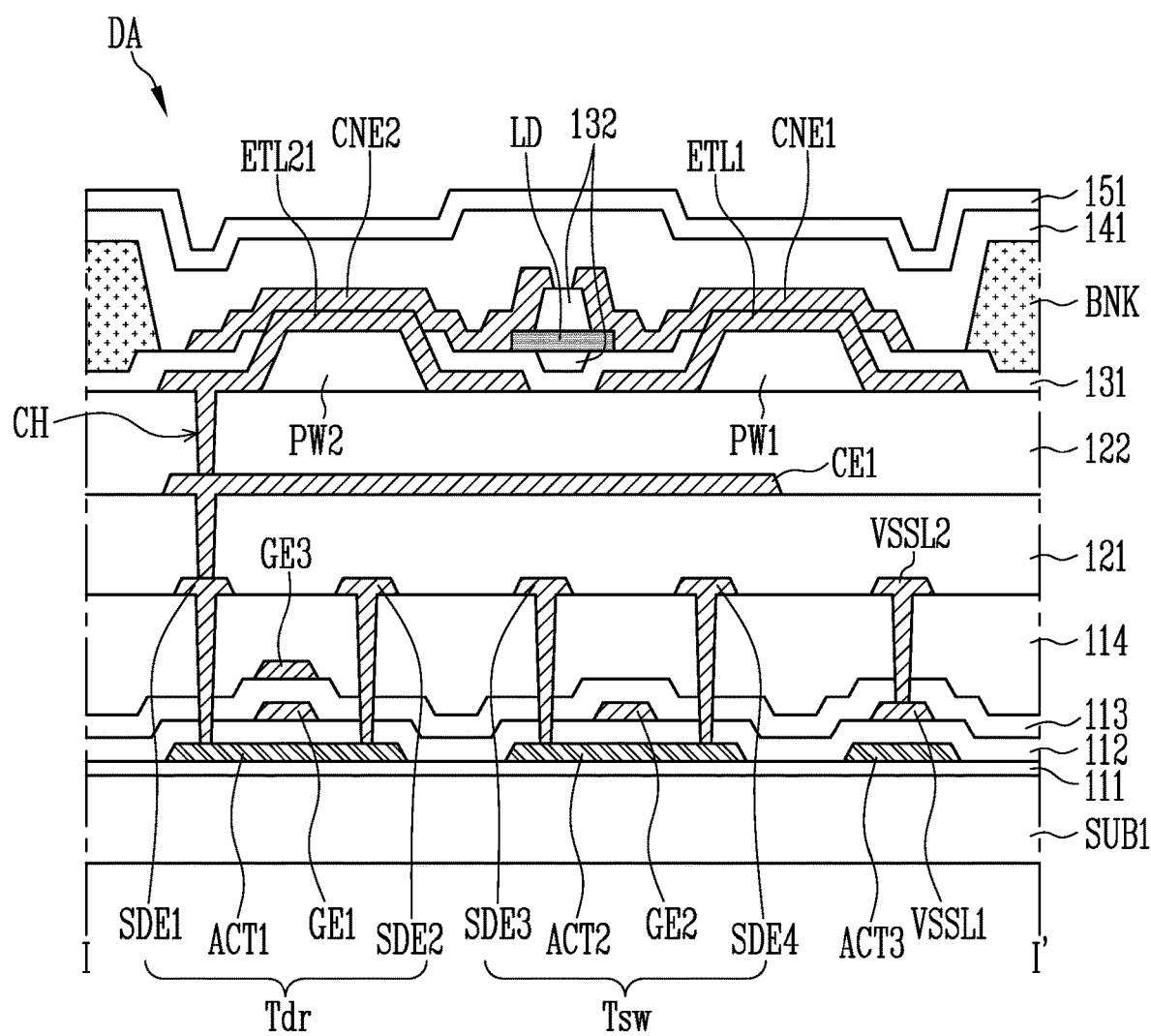
FIG. 14 is a sectional view of the display panel taken along the line I-I' shown in FIG. 13, according to some example embodiments of the present disclosure.
Figure 15:
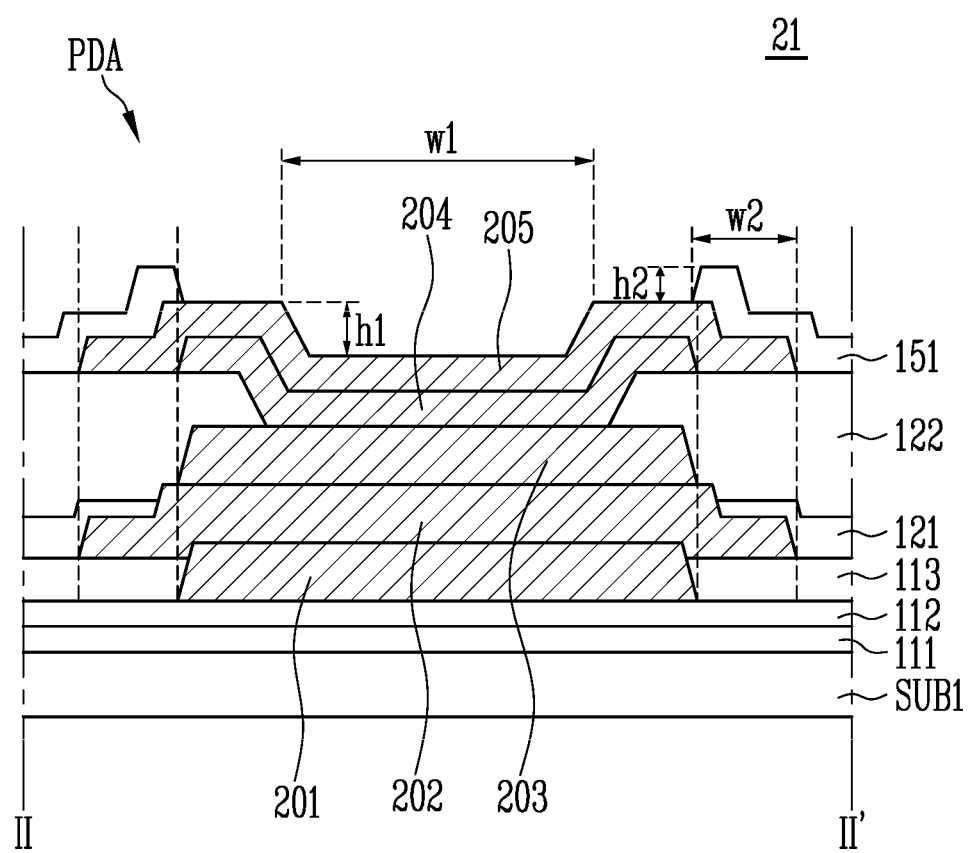
FIG. 15 is a sectional view of the display panel taken along the line II-II' shown in FIG. 7, according to some example embodiments of the present disclosure.
Figure 16:
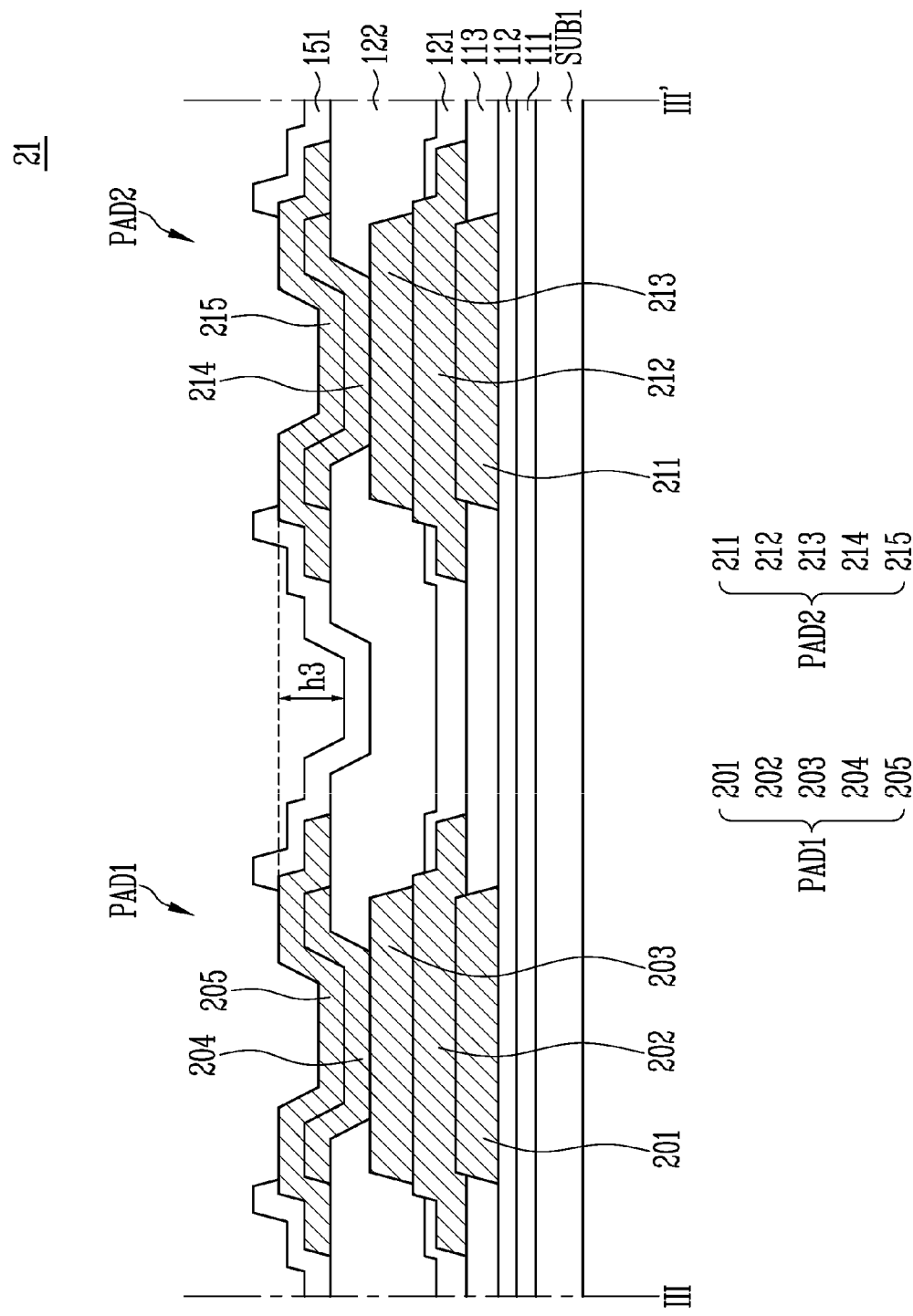
FIG. 16 is a sectional view of the display panel taken along the line III-III' shown in FIG. 7, according to some example embodiments of the present disclosure.

FIG. 14 is a sectional view of the display panel taken along the line I-I' shown in FIG. 13, according to some example embodiments of the present disclosure. FIG. 15 is a sectional view of the display panel taken along the line II-II' shown in FIG. 7, according to some example embodiments of the present disclosure. FIG. 16 is a sectional view of the display panel taken along the line III-III' shown in FIG. 7, according to some example embodiments of the present disclosure. Hereinafter, the display panel will be described based on the first pad PAD1.

Referring to FIGS. 14-16, the display panel 21 may include a base layer SUB1 located at a lower portion of the display panel 21. A description of the base layer SUB1 has been described above, and therefore, overlapping descriptions may not be repeated.

A first buffer layer 111 is located on the base layer SUB1. The first buffer layer 111 smooths a surface of the base layer SUB1, and functions to prevent or reduce penetration of moisture or external air to the components of the display panel 21. The first buffer layer 111 may be an inorganic layer. The first buffer layer 111 may be a single layer or a multi-layer.

A plurality of transistors Tdr and Tsw are located on the first buffer layer 111. Each of the transistors Tdr and Tsw may be a thin film transistor. The two transistors Tdr and Tsw may be a driving transistor and a switching transistor, respectively.

The transistors Tdr and Tsw may include semiconductor pattern ACT1 and ACT2, gate electrodes GE1 and GE2, source electrodes SDE2 and SDE4, and drain electrodes SDE1 and SDE3. For example, a first transistor Tdr may act as the driving transistor, and may include a first semiconductor pattern ACT1, a first gate electrode GE1, a first source electrode SDE2, and a first drain electrode SDE1. A second transistor Tsw may act as the switching transistor, and may include a second semiconductor pattern ACT2, a second gate electrode GE2, a second source electrode SDE4, and a second drain electrode SDE3.

In some embodiments, a semiconductor layer is located on the first buffer layer 111. The semiconductor layer may include the first semiconductor pattern ACT1 and the second semiconductor pattern ACT2, which are described above. Also, the semiconductor layer may further include a third semiconductor pattern ACT3.

In some embodiments, the semiconductor layer may include amorphous silicon, poly-silicon, low temperature poly-silicon, and an organic semiconductor. In some embodiment, the semiconductor layer may be an oxide semiconductor. Although not clearly shown, the semiconductor layer may include a channel region, and a source region and a drain region, which are located at respective sides of the channel region and are doped with an impurity.

A first gate insulating layer 112 is located over the semiconductor layer. The first gate insulating layer 112 may be an inorganic layer. The first gate insulating layer 112 may be a single layer or a multi-layer.

A first conductive layer is located on the first gate insulating layer 112. The first conductive layer may include the first gate electrode GE1 and the second gate electrode GE2. Also, the first conductive layer may further include a first low power pattern VSSL1 and a first pad pattern 201 and 211. The first conductive layer may be made of a metal or a metal alloy, or may include (e.g., formed of) a metallic material having conductivity. For example, the first conductive layer may include molybdenum (Mo), aluminum (Al), copper (Cu), titanium (Ti), etc. The first conductive layer may be a single layer or a multi-layer.

The first low power pattern VSSL1 may be electrically connected to the second power line. The first low power pattern VSSL1 may be in contact with the second low power pattern VSSL2 through a contact hole penetrating the second gate insulating layer 113 and the interlayer insulating layer 114. The first low power pattern VSSL1 may be located in the display area DA, and overlap with the third semiconductor pattern ATC3.

The first pad pattern 201 and 211 may be located in the pad area PDA. The first pad pattern 201 and 211 may be a conductive layer located at the lowest portion constituting the first pad PAD1 and the second pad PAD2, respectively.

A second gate insulating layer 113 is located over the first conductive layer. The second gate insulating layer 113 may be an inorganic layer. The second gate insulating layer 113 may be a single layer or a multi-layer.

A second conductive layer is located on the second gate insulating layer 113. The second conductive layer may include a third gate electrode GE3. The third gate electrode GE3 may be a gate electrode of a transistor which is not shown, but the present disclosure is not limited thereto. The second conductive layer may be made of a metal or a metal alloy, or may include (e.g., formed of) a metallic material having conductivity. For example, the second conductive layer may include molybdenum (Mo), aluminum (Al), copper (Cu), titanium (Ti), etc. The second conductive layer may be a single layer or a multi-layer.

An interlayer insulating layer 114 is located over the second conductive layer. The interlayer insulating layer 114 may be an organic layer or an inorganic layer. The interlayer insulating layer 114 may be a single layer or a multi-layer.

In an embodiment, the interlayer insulating layer 114 may not be located in the pad area PDA. However, this is merely illustrative, and the interlayer insulating layer 114 may be located in the display area DA and the non-display area NDA including the pad area PDA.

A third conductive layer is located on the interlayer insulating layer 114. The third conductive layer may include the source electrodes SDE2 and SDE4 and the drain electrodes SDE1 and SDE3, which are described above. Also, the third conductive layer may further include a second low power pattern VSSL2 and a second pad pattern 202 and 212. The third conductive layer may be made of a metal or a metal alloy, or may include (e.g., formed of) a metallic material having conductivity. For example, the source electrodes SDE2 and SDE4 and the drain electrodes SDE1 and SDE3 may include aluminum (Al), copper (Cu), titanium (Ti), molybdenum (Mo), etc.

The second low power pattern VSSL2 may be electrically connected to the second power line. The second low power pattern VSSL2 may be in contact with the first low power pattern VSSL1 through a contact hole penetrating the second gate insulating layer 113 and the interlayer insulating layer 114. The second low power pattern VSSL2 may be located in the display area DA, and overlap with the first low power pattern VSSL1 and the third semiconductor pattern ACT3.

The second pad pattern 202 and 212 may be located in the pad area PDA. In an embodiment, the second pad pattern 202 and 212 may be directly on the first pad pattern 201 and 211.

The source electrodes SDE2 and SDE4 and the drain electrodes SDE1 and SDE3 may be electrically connected to source regions and drain regions of the corresponding semiconductor patterns ACT1 and ACT2 through contact holes penetrating the interlayer insulating layer 114, the second gate insulating layer 113, and the first gate insulating layer 112, respectively.

Although not separately shown, the display panel 21 may further include a storage capacitor located on the base layer SUB1.

A first protective layer 121 is located over the third conductive layer. The first protective layer 121 is located at a circuit including the transistors Tdr and Tsw. The first protective layer 121 may be located at at least a portion of the non-display area NDA and a portion of the pad area PDA. The first protective layer 121 may be a passivation layer or a planarization layer. The passivation layer may include $SiO_2$, $SiN_x$, etc., and the planarization layer may include a material such as acryl or polyimide. The first protective layer 121 may include both the passivation layer and the planarization layer. The passivation layer may be on the third conductive layer and the interlayer insulating layer 114, and the planarization layer may be on the passivation layer. An upper surface of the first protective layer may be planarized.

A fourth conductive layer may be located on the first protective layer 121. The fourth conductive layer may include several conductive patterns such as a power line, a signal line, and a connection electrode. A case where the fourth conductive layer includes a first connection pattern CE1 located in the display area DA and a third pad pattern 203 and 213 in the pad area PDA is shown in the drawings. The fourth conductive layer may be made of a metal or a metal alloy, or may include (e.g., formed of) a metallic material having conductivity. For example, the fourth conductive layer may include aluminum (Al), copper (Cu), titanium (Ti), molybdenum (Mo), etc.

The first connection pattern CE1 may be in contact with any one of the source electrode SDE2 and the drain electrode SDE1 of the first transistor Tdr through one contact hole penetrating the first protective layer 121.

In some embodiments, the third pad pattern 203 and 213 may be directly disposed on the second pad pattern 202 and 212.

A second protective layer 122 is located over the fourth conductive layer. The second protective layer 122 may be a passivation layer or a planarization layer. The passivation layer may include $SiO_2$, $SiN_x$, etc., and the planarization layer may include a material such as acryl or polyimide. The second protective layer 122 may include both the passivation layer and the planarization layer.

Meanwhile, the second protective layer 122 may include an opening exposing an upper portion of a partial conductive pattern included in the fourth conductive layer. For example, the second protective layer 122 may include one opening exposing at least a portion of the first connection pattern CE1 and another opening exposing at least a portion of the third pad pattern 203 and 213.

The base layer SUB1 to the second protective layer 122 may be referred to as a pixel circuit layer.

Based on the display area DA, first and second partition walls PW1 and PW2, first and second electrode ETL1 and ETL21, a first insulating layer 131, light emitting elements LD, a second insulating layer 132, first and second contact electrodes CNE1 and CNE2, a third insulating layer 141, and a thin film encapsulation layer 151 may be sequentially located on the second protective layer 122.

The first and second partition walls PW1 and PW2 may be located on the pixel circuit layer (i.e., the second protective layer 122). The first and second partition walls PW1 and PW2 may protrude in a thickness direction (e.g., the third direction DR3) on the pixel circuit layer. In some embodiments, the first and second partition walls PW1 and PW2 may substantially have the same height, but the present disclosure is not limited thereto. For example, the protrusion height of each of the first and second partition walls PW1 and PW2 may be about 1.0 μm to 1.5 μm.

In an embodiment, the first partition wall PW1 may be located between the pixel circuit layer and the first electrode ETL1. The second partition wall PW2 may be disposed between the pixel circuit layer and second electrodes ETL21, ETL22, and ETL23.

In some embodiments, the first and second partition walls PW1 and PW2 may have various shapes. In some embodiments, the first and second partition walls PW1 and PW2 may have a sectional shape of a trapezoid of which width becomes narrower as approaching the top thereof. Each of the first and second partition walls PW1 and PW2 may have an inclined surface at least one side thereof.

Although not shown, in another example, the first and second partition walls PW1 and PW2 may have a section of a semicircle or semi-ellipse of which width becomes narrower as approaching the top thereof. Each of the first and second partitions PW1 and PW2 may have a curved surface at least one side thereof. That is, in the present disclosure, the shape of the first and second partition walls PW1 and PW2 is not particularly limited, and may be variously modified. In some embodiments, at least one of the first and second partition walls PW1 and PW2 may be omitted, and its position may be changed.

The first and second partition walls PW1 and PW2 may include an insulating material including an inorganic material and/or an organic material. In an example, the first and second partition walls PW1 and PW2 may include at least one inorganic layer including various inorganic insulating materials currently known in the art, including $SiN_x$, $SiO_x$ or the like. Alternatively, the first and second partition walls PW1 and PW2 may include at least one organic layer and/or at least one photoresist layer, including various organic insulating materials currently known in the art, or be configured as a single or multi-layered insulating structure including organic and/or inorganic materials. That is, the material constituting the first and second partition walls PW1 and PW2 may be variously modified.

In some embodiments, the first and second partition walls PW1 and PW2 may serve as a reflective member. In an example, the first and second partition walls PW1 and PW2 along with the first and second electrodes ETL1 and ETL21 on (e.g., on top of) the first and second partition walls PW1 and PW2 thereof, may serve as a reflective member which may improve the light efficiency of the pixel PXL by inducing light emitted from respective light emitting elements LD in a desired direction.

The first and second electrodes ETL1 and ETL21 may be respectively located on (e.g., on top of) the first and second partition walls PW1 and PW2. The first and second electrodes ETL1 and ETL21 may be spaced from each other.

In some embodiments, the first and second electrodes ETL1 and ETL21 on the first and second partition walls PW1 and PW2 may have shapes corresponding to those of the first and second partition walls PW1 and PW2, respectively. For example, the first and second electrodes ETL1 and ETL21 may protrude in the thickness direction of the display panel 21 while respectively having inclined surfaces or curved surfaces corresponding to the first and second partition walls PW1 and PW2.

Each of the first and second electrodes ETL1 and ETL21 may include at least one conductive material. In an example, each of the first and second electrodes ETL1 and ETL21 may include at least one material from among the metals such as Ag, Mg, Al, Pt, Pd, Au, Ni, Nd, Ir, Cr, Ti, or any metal alloy thereof, for example, a conductive oxide such as ITO, IZO, ZnO, or ITZO, and a conductive polymer such as PEDOT, but the present disclosure is not limited thereto.

Also, each of the first and second electrodes ETL1 and ETL21 may be configured as a single layer or a multi-layer. In some embodiments, each of the first and second electrodes ETL1 and ETL21 may include at least one reflective electrode layer. Also, each of the first and second electrodes ETL1 and ETL21 may selectively further include at least one of at least one transparent electrode layer on the top and/or the bottom of the reflective electrode layer and at least one capping layer covering the top of the reflective electrode layer and/or the transparent electrode layer.

In some embodiments, the reflective electrode layer of each of the first and second electrodes ETL1 and ETL21 may be made of an electrode material having uniform reflexibility. In an example, the reflective electrode layer may include at least one of metals, such as, Ag, Mg, Al, Pt, Pd, Au, Ni, Nd, Ir, Cr, and metal alloys thereof, but the present disclosure is not limited thereto. That is, the reflective electrode layer may be made of various reflective electrode materials. When each of the first and second electrodes ETL1 and ETL21 includes the reflective electrode layer, the first and second electrodes ETL1 and ETL21 may allow light to be emitted from both ends, i.e., one end portions and the other end portions of respective light emitting elements LD to further advance in a direction (e.g., the third direction DR3 or a front direction) in which an image is displayed. In particular, when the first and second electrodes ETL1 and ETL2 face the one end portions and the other end portions of the respective light emitting elements LD while respectively having inclined surfaces or curved surfaces corresponding to the shapes of the first and second partition walls PW1 and PW2, light emitted at the one end portions and the other end portions of the respective light emitting elements LD are reflected by the first and second electrodes ETL1 and ETL21, to further advance in the front direction (e.g., the third direction DR3 as an upper direction of the base layer SUB1) of the display panel 21. Accordingly, the efficiency of light emitted from the light emitting elements LD may be improved.

In addition, the transparent electrode layer of each of the first and second electrodes ETL1 and ETL21 may be made of various transparent electrode materials. In some embodiments, the transparent electrode layer may include ITO, IZO or ITZO, but the present disclosure is not limited thereto. In some embodiments, each of the first and second electrodes ETL1 and ETL21 may be configured as a triple layer having a stacked structure of ITO/Ag/ITO. When each of the first and second electrodes ETL1 and ETL21 is configured as a multi-layer including at least two layers, a voltage drop caused by a signal delay (RC delay) may be minimized or reduced. Accordingly, a desired voltage may be effectively transferred to the light emitting elements LD.

Additionally, when each of the first and second electrodes ETL1 and ETL21 includes a conductive capping layer covering the reflective electrode layer and/or the transparent electrode layer, the reflective electrode layer, etc. of each of the first and second electrodes ETL1 and ETL21 may be prevented (or substantially prevented) from being damaged (or chances of damage may be reduced) due to a defect occurring in a manufacturing process of the pixel PXL. However, the conductive capping layer may be selectively included in the first and second electrodes ETL1 and ETL21. In some embodiments, the conductive capping layer may be omitted. Also, the conductive capping layer may be considered as a component of each of the first and second electrodes ETL1 and ETL21, or be considered as a separate component located on each of the first and second electrodes ETL1 and ETL21.

In some embodiments, at least a partial area of the second electrodes ETL21, ETL22, and ETL23 may overlap with the connection pattern CE1. The second electrodes ETL21, ETL22, and ETL23 may be in contact with the first connection pattern CE1 through first contact holes CH penetrating through the second protective layer 122.

In some embodiments, in the pad area PDA, a fourth pad pattern 204 and 214 may be directly on the third pad pattern 203 and 213. The fourth pad pattern 204 and 214 may be formed to cover portions of the third pad pattern 203 and 213 and the second protective layer 122. In some embodiments, the fourth pad pattern 204 and 214 may be disposed at the same layer as the first and second electrodes ETL1 and ETL21. That is, the fourth pad pattern 204 and 214 may include the same material as the first and second electrodes ETL1 and ETL21, and be concurrently (e.g., simultaneously) located (e.g., formed) with the first and second electrodes ETL1 and ETL21 in the same manner.

The fourth pad pattern 204 and 214 may perform as a primary capping layer for preventing (or substantially preventing) the top of the third pad 203 and 213 from being damaged (or reducing the chance of the third pad 203 and 213 from being damaged) during the manufacturing of the display panel 21.

In some embodiments, the first pad pattern 201 and 211, the second pad pattern 202 and 212, and the fourth pattern 204 and 214 may have the same width.

The first insulating layer 131 may be located partially on the first and second electrodes ETL1 and ETL21 in the display area DA. For example, the first insulating layer 131 may be formed to cover one or more area of the first and second electrodes ETL1 and ETL21, and include an opening exposing another area of the first and second electrodes ETL1 and ETL21.

In some embodiments, the first insulating layer 131 may be primarily located (e.g., formed) to entirely cover the first and second electrodes ETL1 and ETL21. Once the light emitting elements LD are placed and aligned on the first insulating layer 131, the first insulating layer 131 may be partially opened to expose the first and second electrodes ETL1 and ETL21. Alternatively, once the light emitting elements LD are placed and aligned, the first insulating layer 131 may be patterned in the form of a separate pattern locally placed under the light emitting elements LD.

That is, the first insulating layer 131 is interposed between the first and second electrodes ETL1 and ETL21 and the light emitting elements LD, and may expose at least one area of each of the first and second electrodes ETL1 and ETL2. Once the first and second electrodes ETL1 and ETL21 are formed, the first insulating layer 131 is formed to cover the first and second electrodes ETL1 and ETL21, so that damage of the first and second electrodes ETL1 and ETL21 or precipitation of metal may be prevented (or chances of damage may be reduced) in a subsequent process. Further, the first insulating layer 131 may stably support each of the light emitting elements LD. In some embodiments, the first insulating layer 131 may be omitted.

The light emitting elements LD may be supplied and aligned on an area in which the first insulating layer 131 is disposed. In some embodiments, the light emitting elements LD may be supplied through an inkjet technique or the like, and may be aligned between the first and second electrodes ETL1 and ETL21 by a set or predetermined alignment voltage (or alignment signal) applied to the first and second electrodes ETL1 and ETL21.

In some embodiments, the first insulating layer 131 may have a thickness of about 2500 Å to 3500 Å.

A bank BNK may be on the first insulating layer 131. In some embodiments, the bank BNK may be located (e.g., formed) between two adjacent sub-pixels to surround the sub-pixels (SPX1 to SPX3 shown in FIG. 8), to constitute a pixel defining layer defining a light emitting area.

In some embodiments, the bank BNK may not be disposed between the unit pixels SSPX1 to SSPXk in the same sub-pixel SPX1 to SPX3, but the present disclosure is not limited thereto.

In some embodiments, the first insulating layer 131 may not be located (e.g., formed) in the pad area PDA, but the present disclosure is not limited thereto.

The second insulating layer 132 may be on (e.g., on top of) the light emitting elements LD, for example, the light emitting elements LD aligned between the first and second electrodes ETL1 and ETL21, and may expose the two end portions of the light emitting elements LD. For example, the second insulating layer 132 may be partially disposed on the light emitting element LD, without covering the two end portions of the light emitting element LD. The second insulating layer 132 may be located (e.g., formed) as an independent pattern on each light emitting area, but the present disclosure is not limited thereto. In addition, when a separation space exists between the first insulating layer 131 and the light emitting elements LD before the second insulating layer 132 is formed, the space may be filled by the second insulating layer 132 as shown in FIG. 14. Accordingly, the light emitting elements LD may be more stably supported.

In some embodiments, the second insulating layer may have a thickness of about 7500 Å to 8500 Å.

In some embodiments, the second insulating layer 132 may not be located (e.g., formed) in the pad area PDA, but the present disclosure is not limited thereto.

The first and second contact electrodes CNE1 and CNE2 may be on the one end portions and the other end portions of the light emitting elements LD. In some embodiments, the first and second contact electrodes CNE1 and CNE2 may be disposed at the same layer as shown in FIG. 14. The first and second contact electrodes CNE1 and CNE2 may be formed using the same electrode material in the same process, but the present disclosure is not limited thereto.

The first and second contact electrodes CNE1 and CNE2 may electrically connect the one end portions and the other end portions of the light emitting elements LD to the first and second electrodes ETL1 and ETL21, respectively.

For example, the first contact electrode CNE1 may be disposed on the first electrode ETL1 to be in contact with the first electrode ETL1. In some embodiments, the first contact electrode CNE1 may be in contact with the first electrode ETL1 on one area of the first electrode ETL1, which is not covered by the first insulating layer 131. Also, the first contact electrode CNE1 may be on one end portion of at least one light emitting element LD, e.g., a plurality of light emitting elements LD adjacent to the first electrode ETL1 may be in contact with the first electrode ETL1 at one end portion of the respective light emitting element LD. That is, the first contact electrode CNE1 may cover the one end portion of the at least one light emitting element LD and at least one area of the first electrode ETL1, which corresponds thereto. Accordingly, the one end portion of the at least one light emitting element LD may be electrically connected to the first electrode ETL1.

Similarly, the second contact electrode CNE2 may be on the second electrodes ETL21, ETL22, and ETL23 to be in contact with the second electrodes ETL21, ETL22, and ETL23. In some embodiments, the second contact electrode CNE2 may be in contact with the second electrode ETL21 at one area of the second electrode ETL21, which is not covered by the first insulating layer 131. Also, the second contact electrode CNE2 may be at the end portions of at least two light emitting elements LD adjacent to the second electrode ETL21 to be in contact with the end portions of the at least two light emitting elements LD. That is, the second contact electrode CNE2 may cover one end portions or the other end portions of the at least two light emitting elements LD and at least one area of the second electrode ETL21, which corresponds thereto. Accordingly, the one end portions and the other end portions of the at least two light emitting elements LD may be electrically connected to the second electrode ETL21.

That is, one end of the light emitting element LD may be in contact with the first contact electrode CNE1, and the other end portion of the light emitting element LD may be in contact with the second contact electrode CNE2.

In some embodiments, in the pad area PDA, a fifth pad pattern 205 and 215 may be directly on the fourth pad pattern 204 and 214. The fifth pad pattern 205 and 215 corresponds to a pad pattern located at the uppermost portion of each of the pads PDA1 and PDA2. The fifth pad pattern 205 and 215 may be disposed at the same layer as the first and second contact electrodes CNE1 and CNE2. That is, the fifth pad pattern 205 and 215 may include the same material as the first and second contact electrodes CNE1 and CNE2, and be concurrently (e.g., simultaneously) located (e.g., formed) in the same manner.

In an embodiment, the fifth pad pattern 205 and 215 and the first and second contact electrodes CNE1 and CNE2 may be made of a transparent conductive material such as ITO, IZO or ITZO such that the light emitted from the light emitting elements LD may be transmitted therethrough.

In some embodiments, the fifth pad pattern 205 and 215 may include a groove at an upper portion thereof. An external terminal in contact with the first pad PAD1 may be in contact with the first pad PAD1 through the groove at the upper portion of the fifth pad pattern 205 and 215. In some embodiments, the groove may have a width of about 20 μm or more and a depth h1 of about 1 μm or less. That is, the groove at the upper portion of the first pad PAD1 may have a ratio of depth to width w1, which is 20 or more.

The fifth pad pattern 205 and 215 may perform a function of a secondary capping layer for preventing the top of the third pad 203 and 213 from being damaged in the manufacturing process of the display panel 21. For example, the fifth pad pattern 205 and 215 may perform a function of a secondary capping layer to reduce the chance of the top of the third pad 203 and 213 is damaged in the manufacturing process of the display panel 21.

In some embodiments, the width of the fifth pad pattern 205 and 215 may be equal to that of the third pad pattern 203 and 213.

The third insulating layer 141 may be formed and/or disposed over the first and second partition walls PW1 and PW2, the first and second electrodes ETL1 and ETL21, the light emitting elements LD, the first and second contact electrodes CNE1 and CNE2, and the bank BNK to cover the first and second partition walls PW1 and PW2, the first and second electrodes ETL1 and ETL21, the light emitting elements LD, the first and second contact electrodes CNE1 and CNE2, and the bank BNK.

In some embodiments, the third insulating layer 141 may have a thickness of about 2500 Å to 3500 Å.

In some embodiments, each of the first to third insulating layers 131, 132, and 141 may be configured in a single layer or a multi-layer, and may include at least one inorganic insulating material and/or at least one organic insulating material. For example, each of the first to third insulating layers 131, 132, and 141 may include various kinds of organic/inorganic insulating materials known to those skilled in the art, including $SiN_x$, and the material constituting each of the first to third insulating layers 131, 132, and 141 is not particularly limited. In addition, the first to third insulating layers 131, 132, and 141 may include different insulating materials. Alternatively, at least some of the first to third insulating layers 131, 132, and 141 may include the same insulating material.

The thin film encapsulation layer 151 including at least one inorganic layer and/or at least one organic layer, may be located on the third insulating layer 141. The thin film encapsulation layer 151 may be an insulating layer. In some embodiments, the thin film encapsulation layer 151 may be omitted.

In some embodiments, the thin film encapsulation layer 151 may be located (e.g., formed) throughout the entire display area DA. In some embodiments, the thin film encapsulation layer 151 may be formed to expose an upper portion of the fifth pad pattern 205 and 215 in the pad area PDA, and accordingly, each groove of the pads PAD1 and PAD2 may be exposed.

The thin film encapsulation layer 151 may overlap with a partial area of an edge of the fifth pad pattern 205 and 215. In some embodiments, a width w2 of an area in which the thin film encapsulation layer 151 overlaps with the fifth pad pattern 205 and 215 may be about 2 μm to 3 μm.

In some embodiments, a thickness h2 of the thin film encapsulation layer 151 may be about 6000 Å or less.

The second pad PAD2 may be adjacent to the first pad PAD1. The second pad PAD2 may be separated from the first pad PAD1 with insulating materials interposed therebetween. In an embodiment, a distance between the first pad PAD1 and the second pad PAD2 may be about 15 μm to 25 μm.

Each of the pads PAD1 and PAD2 may be surrounded by an insulating material. In some embodiments, a step difference h3 between the top of each of the pads PAD1 and PAD2 (i.e., the top of the fifth pad pattern 205 and 215) and the insulating material between the pads PAD1 and PAD2 (i.e., the top of the thin film encapsulation layer 151) may be about 0.6 μm to 2.0 μm.

The top of the pads PAD1 and PAD2 are located (e.g., formed) with the fourth pad pattern 204 and 214 and the fifth pad pattern 205 and 215, so that an oxide layer may be prevented from being located (e.g., formed) on the third pad pattern 203 and 213 in the manufacturing process or chances of an oxide layer being formed on the third pad pattern 203 and 213 in the manufacturing process may be reduced. Accordingly, an additional mask for preventing the oxide layer located (e.g., formed) on the third pad pattern 203 and 213 may be minimized or reduced.

Next, a display panel in accordance with another embodiment will be described. Hereinafter, components identical or similar to those described with reference to FIGS. 1-16 are designated by like reference numerals, and overlapping descriptions may not be repeated.

Figure 17:
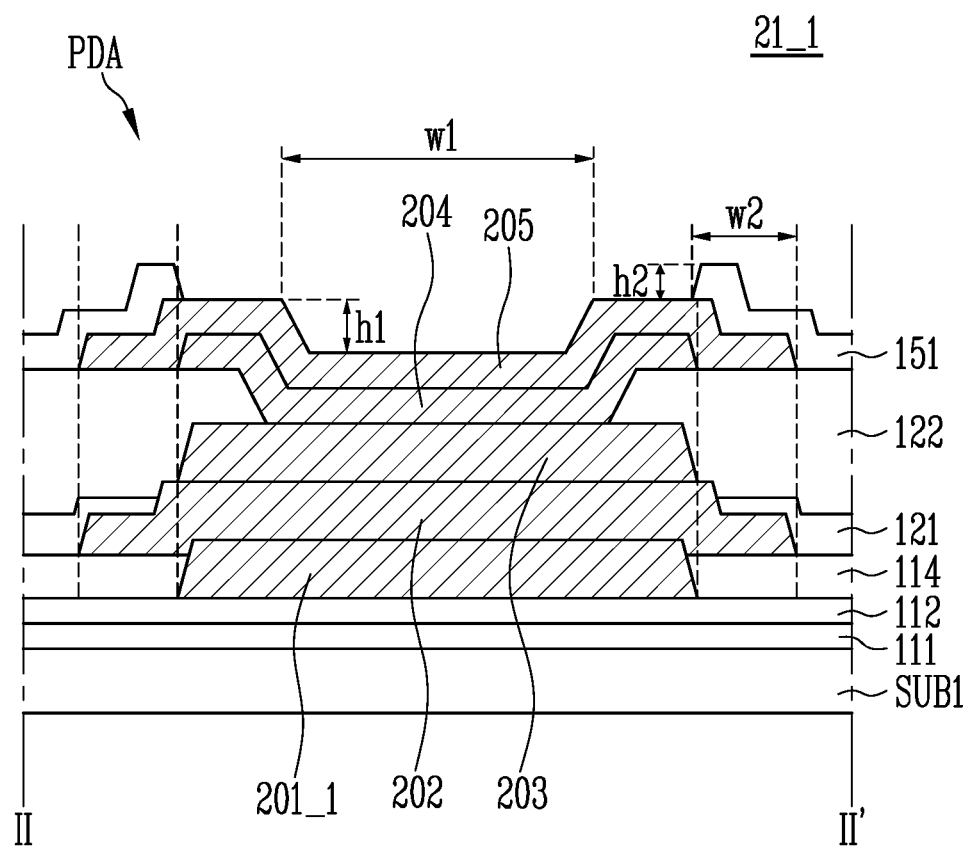
FIGS. 17-19 are sectional views of display panels in accordance with some example embodiments of the present disclosure.
Figure 18:
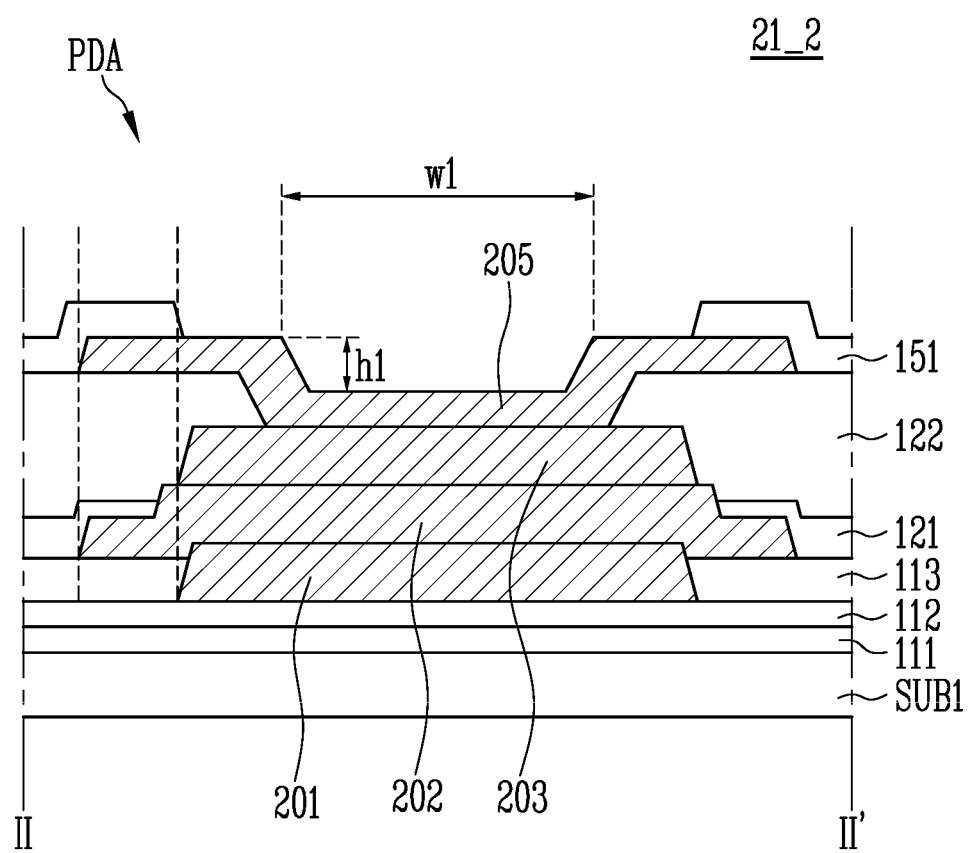
Figure 19:
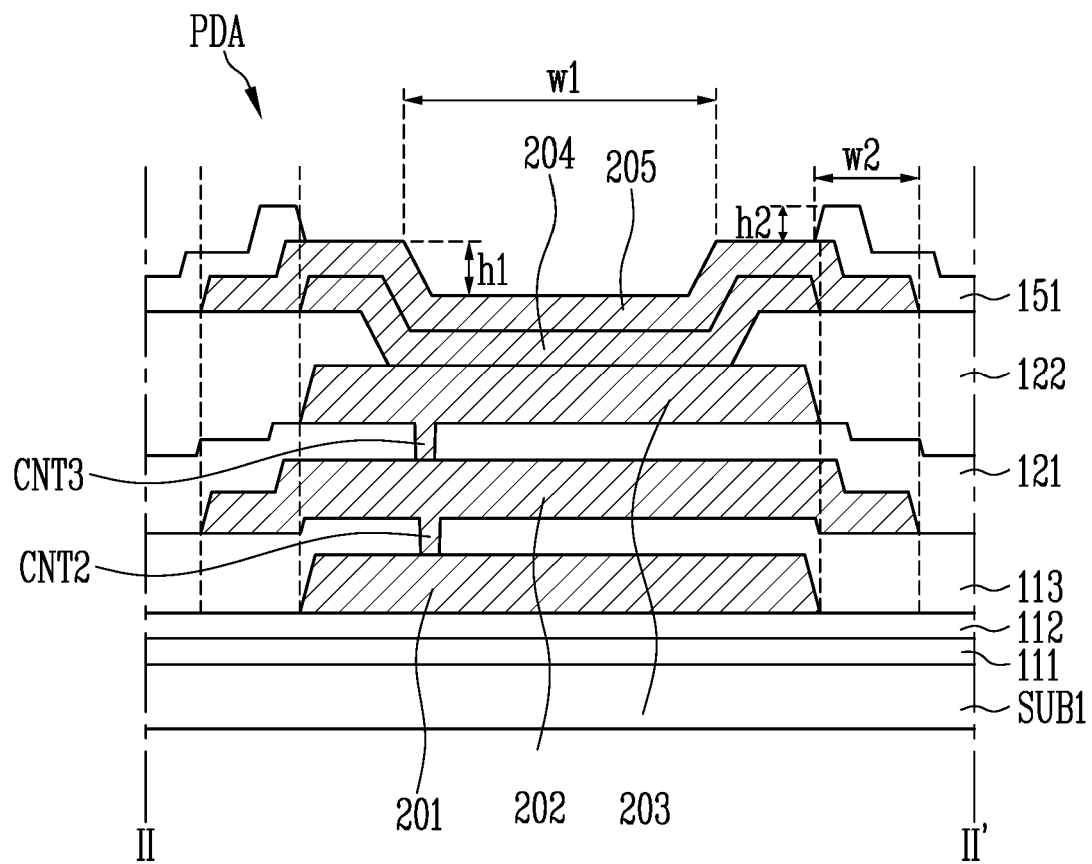

FIGS. 17-19 are sectional views of display panels in accordance with some embodiments of the present disclosure. FIGS. 17-19 correspond to modifications of FIG. 15, according to some example embodiments of the present disclosure.

Referring to FIG. 17, a display panel 21_1 in accordance with this example embodiment is different from the display panel 21 shown in FIG. 15, in that a first pad pattern 201_1 corresponds to the second conductive layer.

Referring to FIG. 18, a display panel 21_2 in accordance with this example embodiment is different from the display panel 21 shown in FIG. 15, in that the fourth pad pattern 204 is omitted. The fifth pad pattern 205 may be directly on the third pad pattern 203.

Referring to FIG. 19, a display panel 21_3 in accordance with this embodiment is different from the display panel 21 shown in FIG. 15, in that the second pad pattern 202 is not directly on the first pad pattern 201 and the third pad pattern 203 is not directly on the second pad pattern 202. The second gate insulating layer 113 may be over the first pad pattern 201, and the first protective layer 121 may be over the second pad pattern 202. The second pad pattern 202 may be in contact with the first pad pattern 201 through a second contact hole CNT2 located (e.g., formed) in the second gate insulating layer 113. The third pad pattern 203 may be in contact with the second pad pattern 202 through a third contact hole CNT3 located (e.g., formed) in the first protective layer 121.

Although a case where one second contact hole CNT2 and one third contact hole CNT3 are respectively located (e.g., formed) in the second gate insulating layer 113 and the first protective layer 121 is illustrated in the drawing, the present disclosure is not limited thereto. A plurality of second contact holes CNT2 and a plurality of third contact holes CNT3 may be respectively located (e.g., formed) in the second gate insulating layer 113 and the first protective layer 121.

Figure 20:
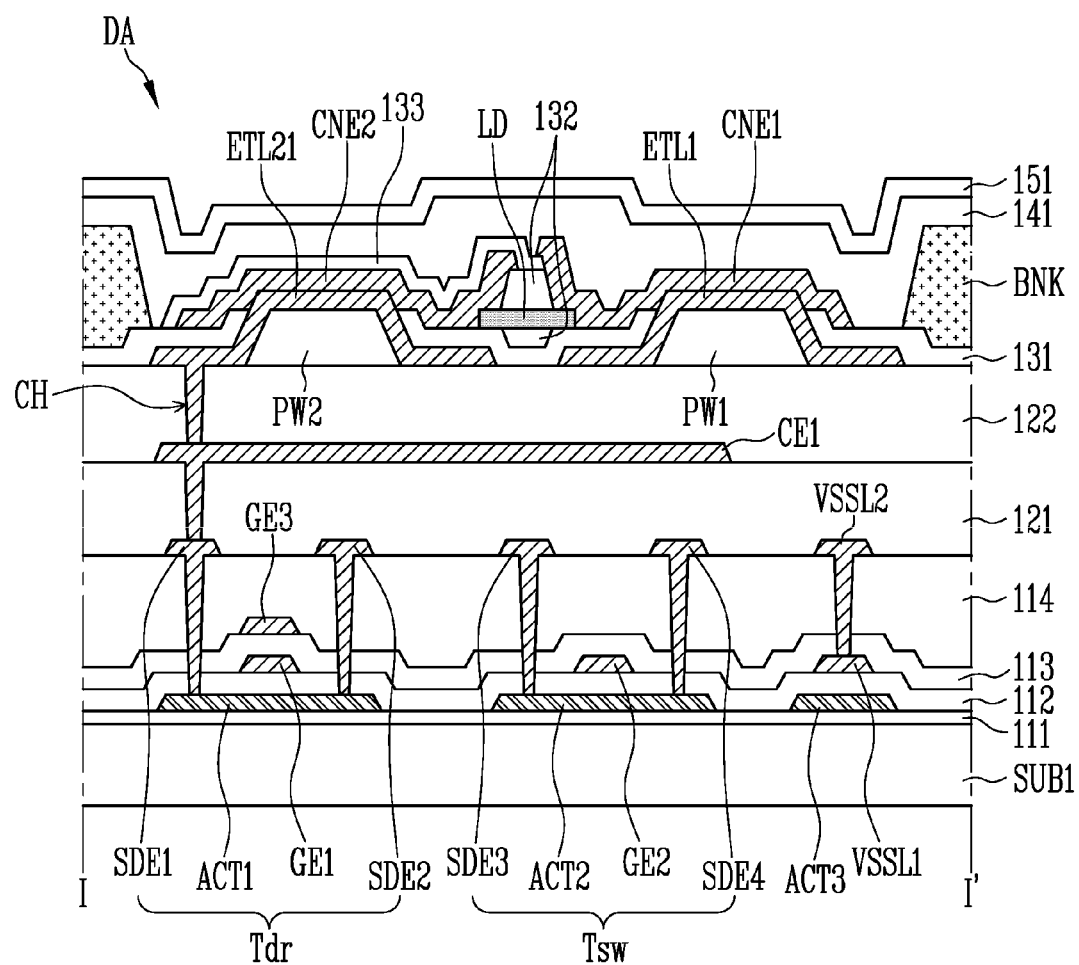
FIGS. 20 and 21 are sectional views of a display panel in accordance with some example embodiments of the present disclosure.
Figure 21:
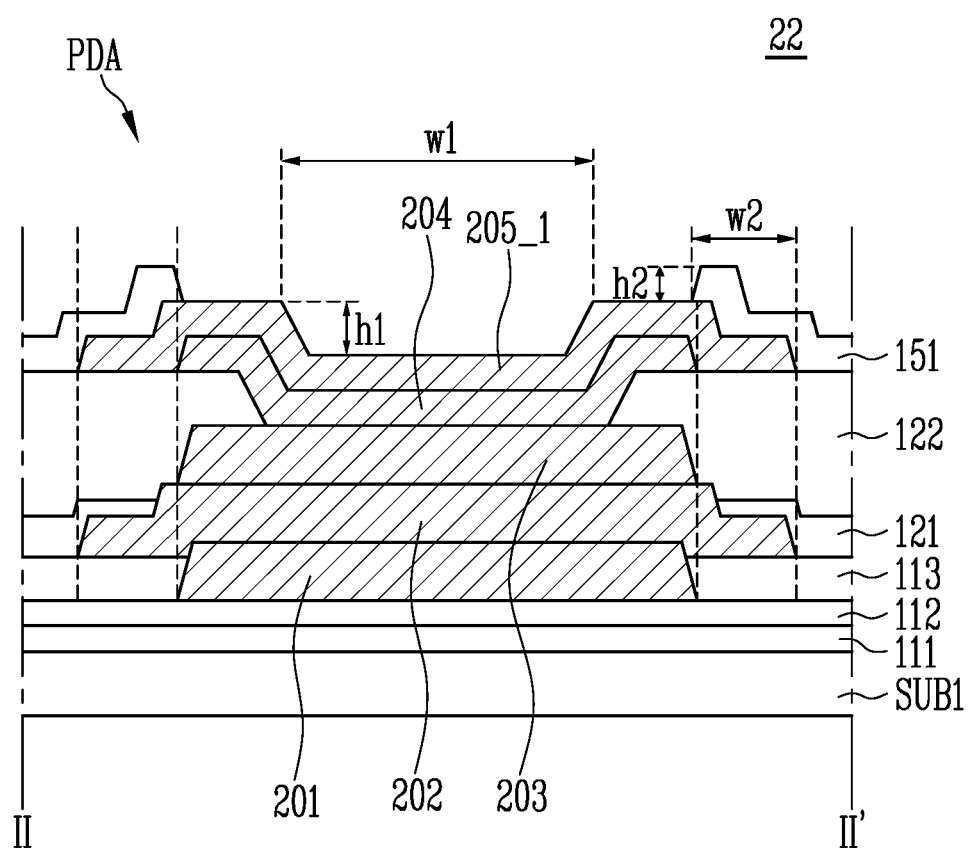

FIGS. 20 and 21 are sectional views of a display panel in accordance with still another embodiment of the present disclosure. FIGS. 20 and 21 respectively correspond to modifications of FIGS. 14 and 15.

Referring to FIGS. 20 and 21, the display panel 22 in accordance with some embodiments of the present disclosure is different from the display panel 21 shown in FIG. 15, in that the display panel 22 further includes a fourth insulating layer 133, and the first contact electrode CNE1 and the second contact electrode CNE2 are in different layers.

In some embodiments, the fourth insulating layer 133 may be over the second contact electrode CNE2. The fourth insulating layer 133 may be formed to cover the second contact electrode CNE2.

After the second contact electrode CNE2 is formed, the first contact electrode CNE1 may be formed. The first contact electrode CNE1 may be disposed partially at the fourth insulating layer 133.

In some embodiments, the first contact electrode CNE1 may include a conductive material including Al, Ti, Cr, and the like, which has a work function smaller than about 4.1 eV. The second contact electrode CNE2 may include a conductive material including Ni, ITO, and the like, which has a work function greater than about 7.5 eV.

A fifth pattern 205_1 may be located (e.g., formed) at the same layer as the second contact electrode CNE2.

Figure 22:
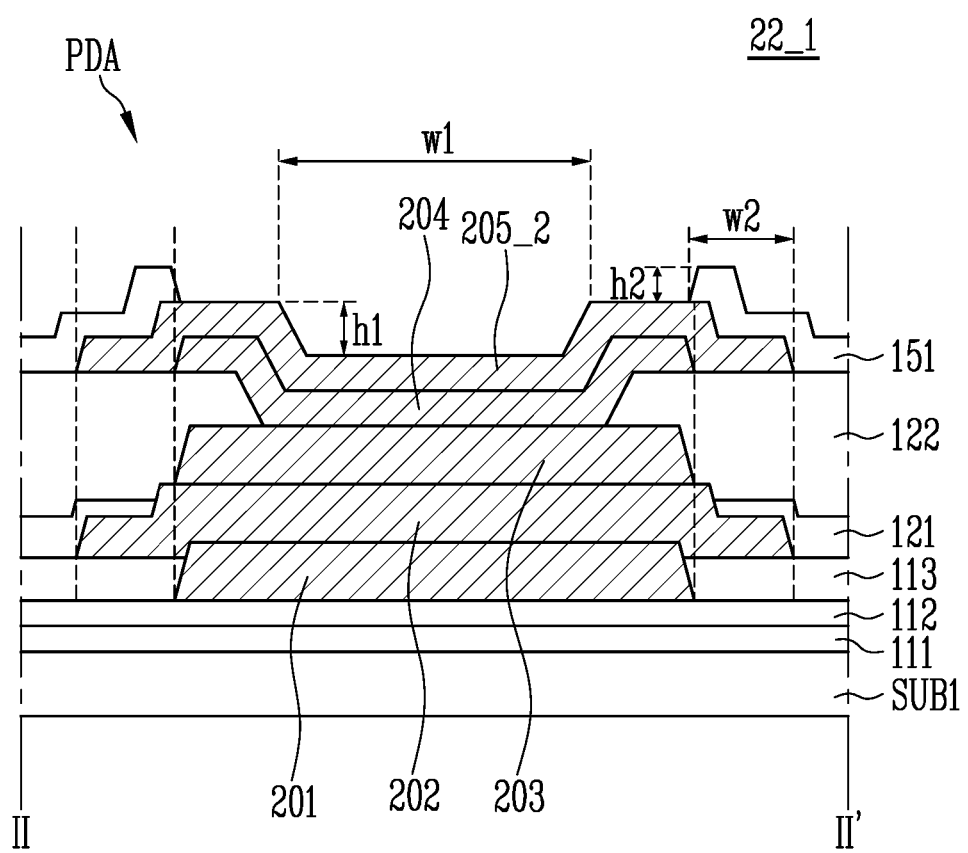
FIG. 22 is a sectional view of a display panel in accordance with some example embodiments of the present disclosure.
Figure 23:
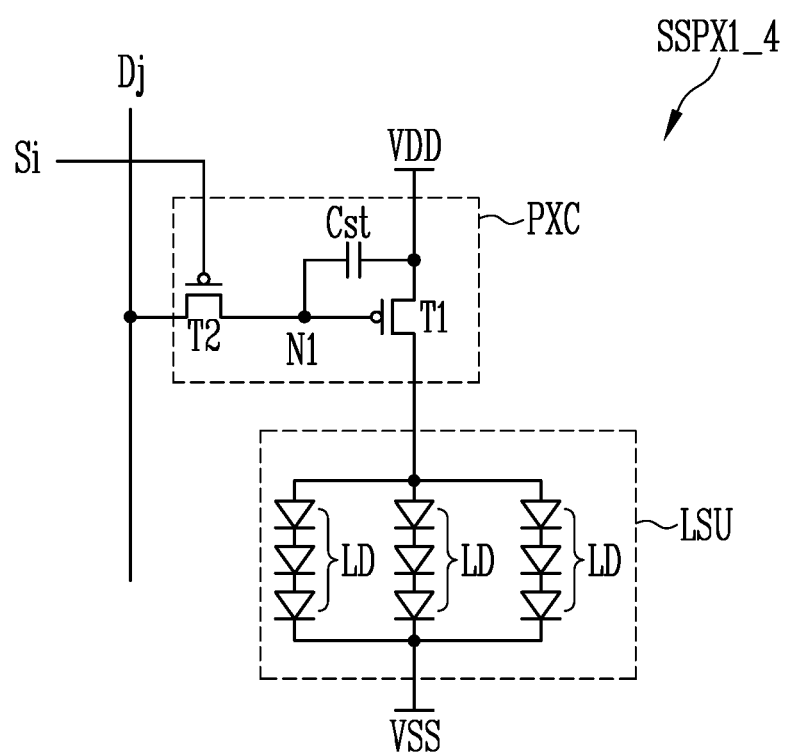
FIGS. 23-26 are example circuit diagrams applicable as a unit pixel included in a sub-pixel of a display panel in accordance with some example embodiments of the present disclosure.
Figure 24:
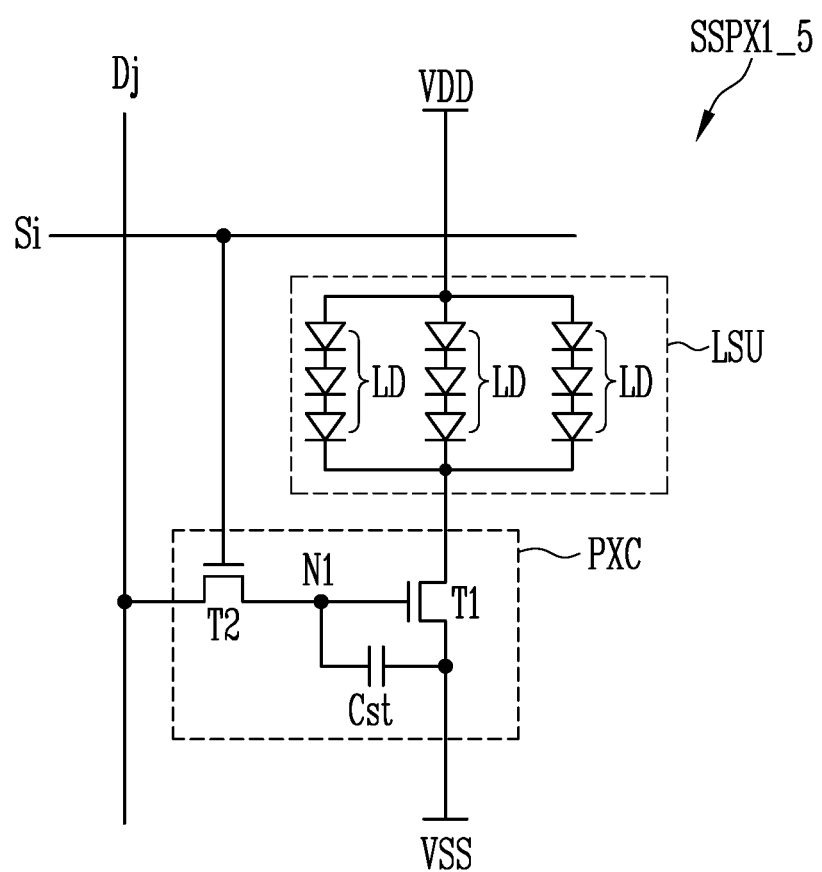
Figure 25:
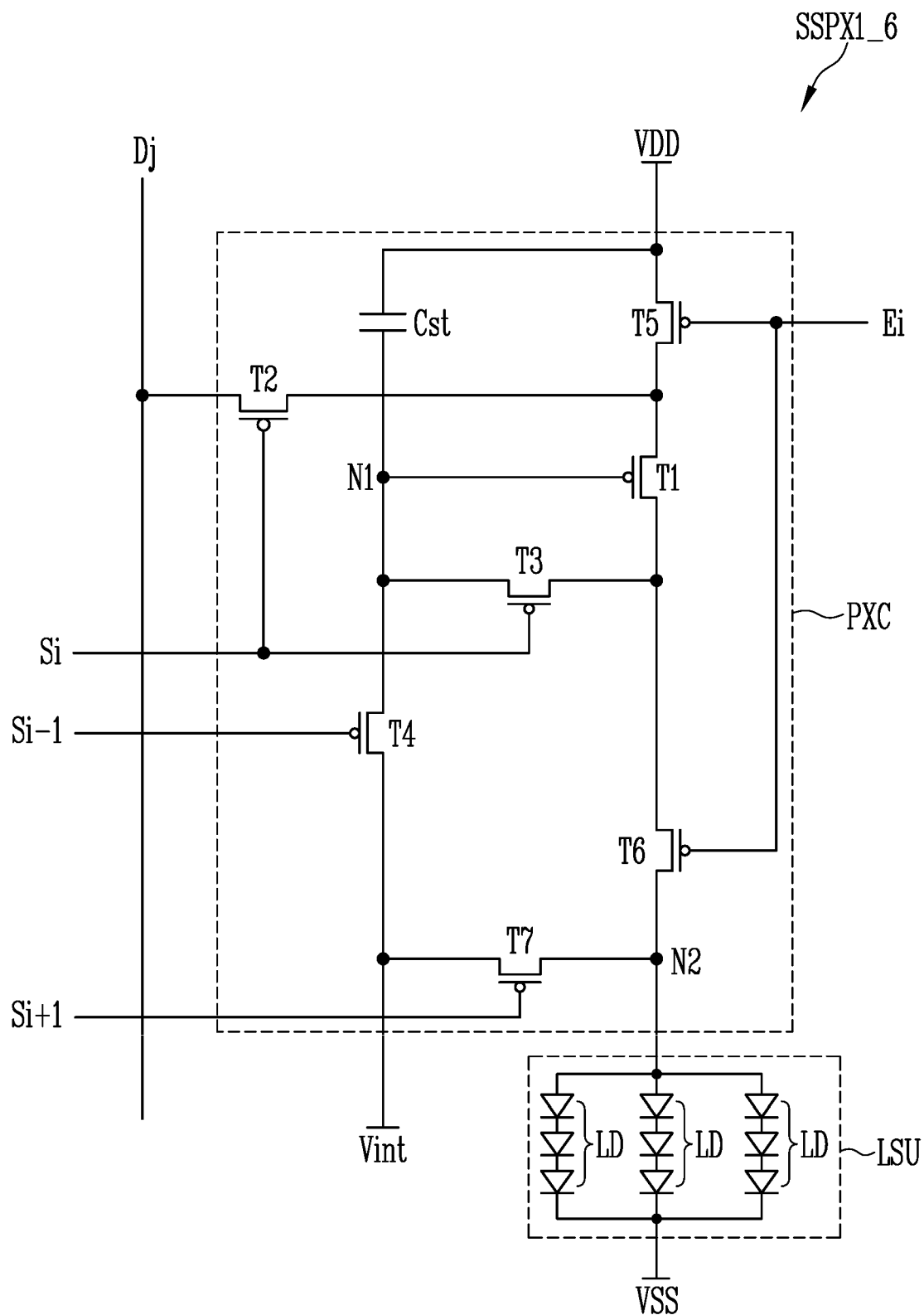
Figure 26:
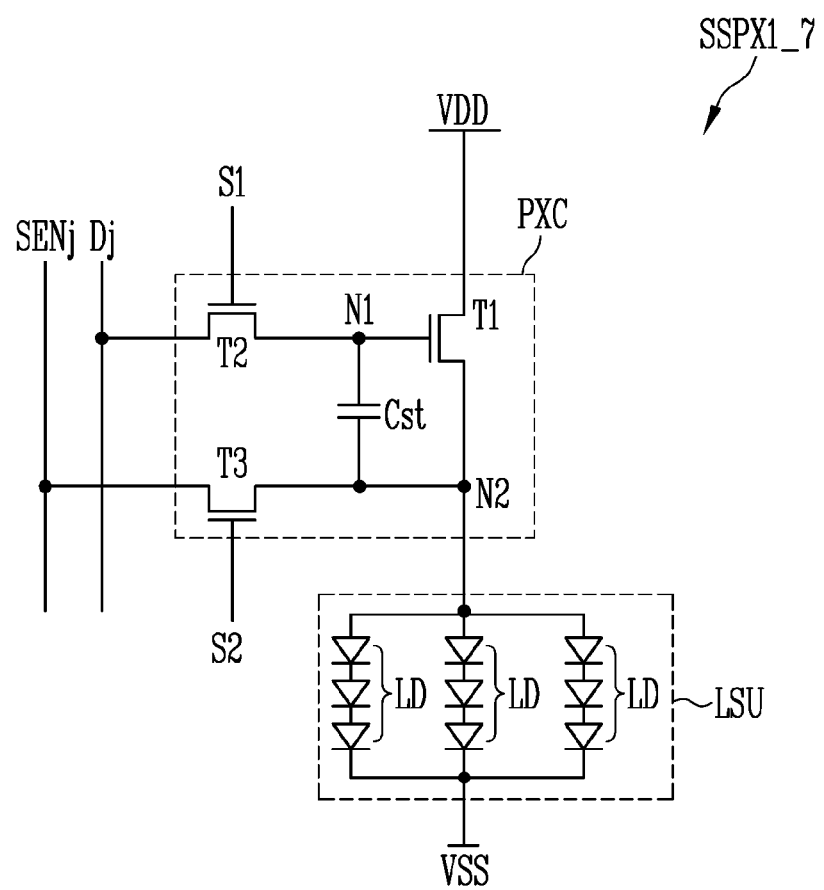

FIG. 22 is a sectional view of a display panel in accordance with still another example embodiment of the present disclosure. FIG. 22 corresponds to a modification of FIG. 21, according to some example embodiments of the present disclosure.

Referring to FIG. 22, a fifth pad pattern 205_2 may be located (e.g., formed) at the same layer as the first contact electrode CNE1.

FIGS. 23-26 are example circuit diagrams of a unit pixel included in a sub-pixel of a display panel in accordance with still another example embodiment of the present disclosure. FIGS. 23-26 respectively correspond to modifications of FIGS. 9-12.

Referring to FIGS. 23-26, a plurality of light emitting elements LD may be connected in series and/or in parallel with each other.

Figure 27:
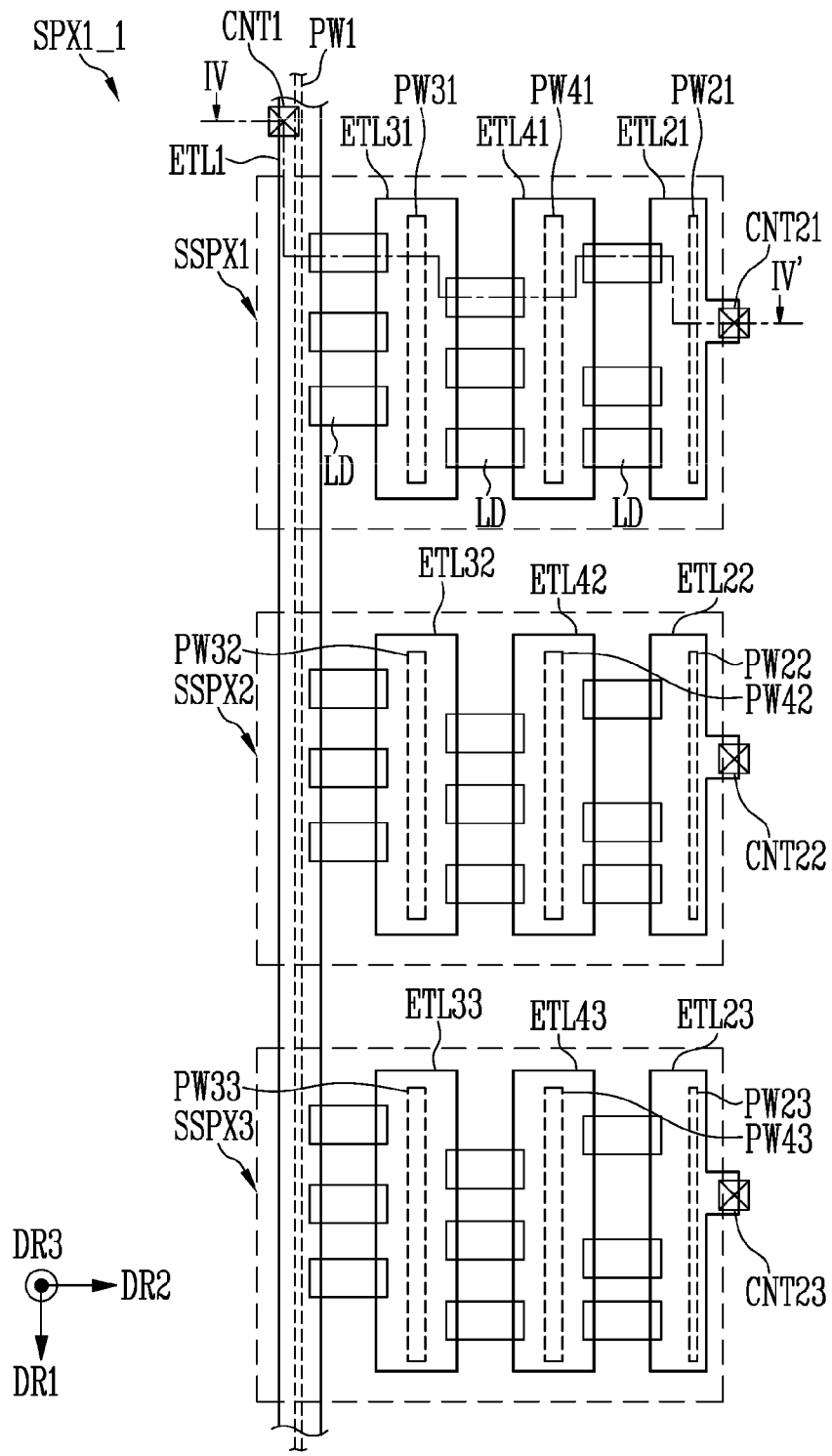
FIG. 27 is a plan layout view illustrating an arrangement of some components in one sub-pixel included in a display panel in accordance with some example embodiments of the present disclosure.
Figure 28:
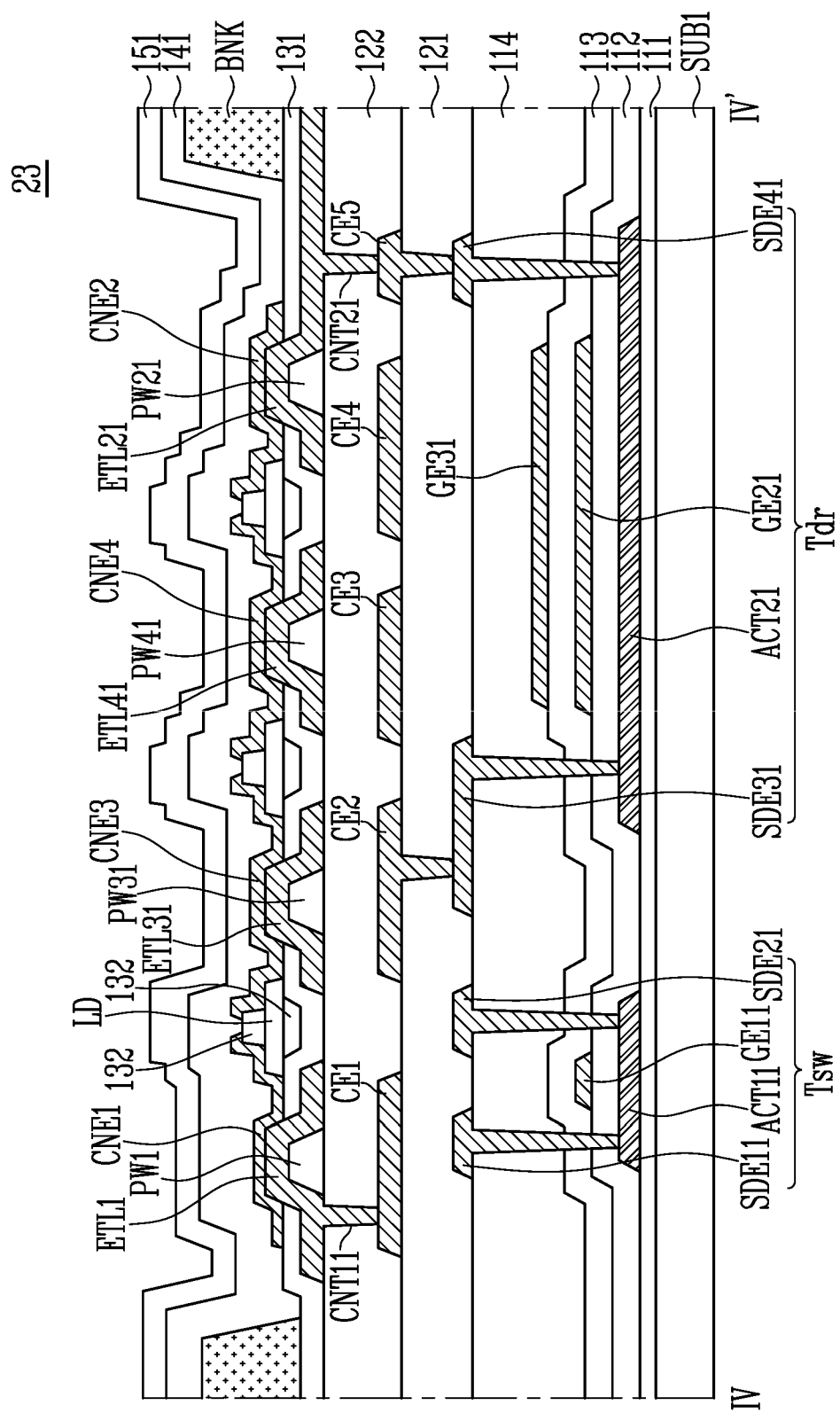
FIG. 28 is a sectional view of the display panel taken along the line IV-IV' shown in FIG. 27, according to some example embodiments of the present disclosure.

FIG. 27 is a plan layout view illustrating an arrangement of some components in one sub-pixel included in a display panel 23 in accordance with still another example embodiment of the present disclosure. FIG. 28 is a sectional view of the display panel 23 taken along the line IV-IV' shown in FIG. 27. The display panel 23 shown in FIGS. 27 and 28 corresponds to the embodiment in which the light emitting elements LD shown in FIGS. 23-26 are applied. First to third unit pixels SSPX1 to SSPX3 are identical to one another, and therefore, the first unit pixel SSPX1 will be primarily described.

Referring to FIGS. 27 and 28, the display panel 23 is different from the display panel 21 shown in FIGS. 13 and 14, in that island electrodes are included between the first electrode ETL1 and the second electrodes ETL21, ETL22, and ETL23.

First to fourth electrodes ETL1, ETL21, ETL31, and ETL41 in the first unit pixel SSPX1 may roughly extend in a first direction DR1, and may be located side by side (in parallel) to be spaced from each other in a second direction DR2 at a set or predetermined distance. In some embodiments, an extension length of the first electrode ETL1 in the first direction DR1 may be longer than those of the second to fourth electrodes ETL21, ETL31, and ETL41 in the first direction DR1. The third electrode ETL31 and the fourth electrode ETL41 may be located between the first electrode ETL1 and the second electrode ETL21. The third electrode ETL31 and the fourth electrode ETL41 may be island electrodes floated from the first electrode ETL1 and the second electrode ETL21. Accordingly, each of the third electrode ETL31 and the fourth electrode ETL41 may be referred to as an island electrode.

In some embodiments, the first electrode ETL1 may be an electrode shared by the first to third unit pixels SSPX1 to SSPX3. The first to third unit pixels SSPX1 to SSPX3 may be arranged along the first direction DR1. First to fourth electrodes ETL1, ETL22, ETL32, and ETL42 in the second unit pixel SSPX2 may roughly extend along the first direction DR1, and be located side by side (in parallel) to be spaced from each other in the second direction DR2 at a set or predetermined distance. Similarly, first to fourth electrodes ETL1, ETL23, ETL33, and ETL43 in the third unit pixel SSPX3 may roughly extend along the first direction DR1, and be located side by side (in parallel) to be spaced from each other in the second direction DR2 at a set or predetermined distance.

Light emitting elements LD may be placed between the first electrode ETL1 and the third electrode ETL31, between the second electrode ETL21 and the fourth electrode ETL41, and between the third electrode ETL31 and the fourth electrode ETL41.

A transistor Tdr may act as the driving transistor, and may include a first semiconductor pattern ACT21, a first gate electrode GE21, a first source electrode SDE31, and a first drain electrode SDE41. A second transistor Tsw may act as the switching transistor, and may include a second semiconductor pattern ACT11, a second gate electrode GE11, a second source electrode SDE11, and a second drain electrode SDE21.

An example case where a fourth conductive layer on a first protective layer 121 includes first to fifth conductive patterns CE1 to CE5 is shown in the drawings (e.g., FIG. 28).

The second conductive pattern CE2 may be connected to any one of the first source electrode SDE31 and the first electrode SDE41 of the first transistor Tdr through one contact hole penetrating the first protective layer 121, and the fifth conductive pattern CE5 may be connected to the other ones of the first source electrode SDE31 and the first drain electrode SDE41 of the first transistor Tdr through another contact hole penetrating the first protective layer 121.

First to fourth partition walls PW1, PW21, PW31, and PW41, first to fourth electrodes ETL1, ETL21, ETL31, and ETL41, a first insulating layer 131, light emitting elements LD, a second insulating layer 133, first to fourth contact electrodes CNE1 to CNE4, a third insulating layer 141, and a thin film encapsulation layer 151 may be sequentially located on a second protective layer 122.

The first to fourth partition walls PW1, PW21, PW31, and PW41 may be located on a pixel circuit layer (i.e., the second protective layer 122). The first to fourth partition walls PW1, PW21, PW31, and PW41 may protrude in a thickness direction (e.g., a third direction DR3) on the pixel circuit layer.

The first to fourth electrodes ETL1, ETL21, ETL31, and ETL41 may be respectively on the first to fourth partition walls PW1, PW21, PW31, and PW41. The first to fourth electrodes ETL1, ETL21, ETL31, and ETL41 may be spaced from each other.

In some embodiments, at least a partial area of the first electrode ETL1 may overlap with the first conductive pattern CE1, at least a partial area of the second electrode ETL21 may overlap with the fourth conductive pattern CE4 and the fifth conductive pattern CE5, at least a partial area of the third electrode ETL31 may overlap with the second conductive pattern CE2, and at least a partial area of the fourth electrode ETL41 may overlap with the third conductive pattern CE3.

The first electrode ETL1 may be electrically connected to the first conductive pattern CE1 through a first contact hole CNT11, and the second electrode ETL21 may be electrically connected to the fifth conductive pattern CE5 through a second contact hole CNT21. The fifth conductive pattern CE5 may correspond to the first connection pattern CE1 shown in FIG. 14. The third electrode ETL31 may be insulated from the second conductive pattern CE2, the fourth electrode ETL41 may be insulated from the third conductive pattern CE3, and the second electrode ETL21 may be insulated from the fourth conductive pattern CE4.

The first to fourth contact electrodes CEN1 to CEN4 may be on the first to fourth electrodes ETL1, ETL21, ETL31, and ETL41 and one end portions and the other end portions of the light emitting elements LD. In some embodiments, the first to fourth contact electrodes CNE1 to CNE4 may be located at the same layer as shown in FIG. 28. The first to fourth contact electrodes CNE1 to CNE4 may be formed using the same electrode material in the same process, but the present disclosure is not limited thereto.

The first contact electrode CNE1 may be on the first electrode ETL1 to be in contact with the first electrode ETL1. In some embodiments, the first contact electrode CNE1 may be in contact with the first electrode ETL1 on one area of the first electrode ETL1, which is not covered by a first insulating layer 131. Also, the first contact electrode CNE1 may be on one end portion of at least one light emitting element LD, e.g., a plurality of light emitting elements LD adjacent to the first electrode ETL1 to be in contact with the one end portion of the light emitting element LD. That is, the first contact electrode CNE1 may cover the one end portion of the at least one light emitting element LD and at least one area of the first electrode ETL1, which corresponds thereto. Accordingly, the one end portion of the at least one light emitting element LD may be electrically connected to the first electrode ETL1.

Similarly, the third contact electrode CNE3 may be on the third electrode ETL31 to be in contact with the third electrode ETL31. In some embodiments, the third contact electrode CNE3 may be in contact with the third electrode ELT31 on one area of the third electrode ETL31, which is not covered by the first insulating layer 131. Also, the third contact electrode CNE3 may be on end portions of at least two light emitting elements LD adjacent to the third electrode ETL31 to be in contact with the end portions of the at least two light emitting elements LD. That is, the third contact electrode CNE3 may cover one end portions or the other end portions of the at least two light emitting elements LD and at least one area of the third electrode ETL31, which corresponds thereto. Accordingly, the one end portions or the other end portions of the at least two light emitting elements LD may be electrically connected to the third electrode ETL31.

Similarly, the fourth contact electrode CNE4 may be on the fourth electrode ETL41 to be in contact with the fourth electrode ETL41. In some embodiments, the fourth contact electrode CNE4 may be in contact with the fourth electrode ELT41 on one area of the fourth electrode ETL41, which is not covered by the first insulating layer 131. Also, the fourth contact electrode CNE4 may be on end portions of at least two light emitting elements LD adjacent to the fourth electrode ETL41 to be in contact with the end portions of the at least two light emitting elements LD. That is, the fourth contact electrode CNE4 may cover one end portions or the other end portions of the at least two light emitting elements LD and at least one area of the fourth electrode ETL41, which corresponds thereto. Accordingly, the one end portions or the other end portions of the at least two light emitting elements LD may be electrically connected to the fourth electrode ETL41.

Similarly, the second contact electrode CNE2 may be on the second electrode ETL21 to be in contact with the second electrode ETL21. In some embodiments, the second contact electrode CNE2 may be in contact with the second electrode ETL2 on one area of the second electrode ETL21, which is not covered by the first insulating layer 131. Also, the second contact electrode CNE2 may be on the other end portion of the at least one light emitting element LD adjacent to the second electrode ETL21 to be in contact with the other end portion of the at least one light emitting element LD. That is, the second contact electrode CNE2 may cover the other end portion of the at least one light emitting element LD and at least one area of the second electrode ETL21, which corresponds thereto. Accordingly, the other end portion of the at least one light emitting element LD may be electrically connected to the second electrode ETL21.

That is, one end portion of one light emitting element LD may be in contact with the first contact electrode CNE1, and the other end of the one light emitting element may be in contact with the third contact electrode CNE3. One end portion of another light emitting element may be in contact with the third contact electrode CNE3, and the other end portion of another light emitting element may be in contact with the fourth contact electrode CNE4. One end portion of still another light emitting element may be in contact with the fourth contact electrode CNE4, and the other end portion of the still another light emitting element may be in contact with the first contact electrode CNE1.

Figure 29:
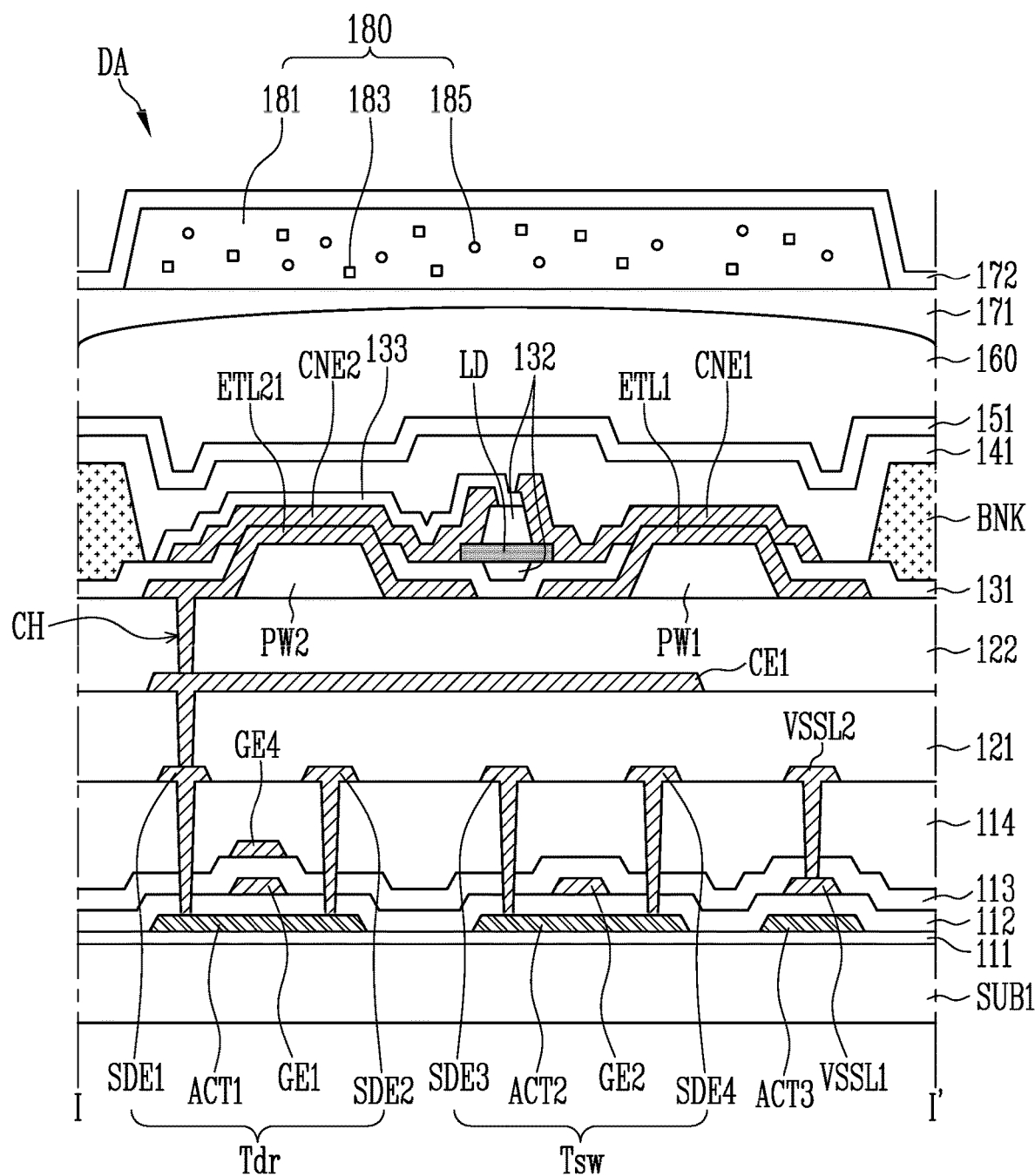
FIG. 29 is a sectional view of a display panel in accordance with some example embodiments of the present disclosure.

FIG. 29 is a sectional view of a display panel in accordance with still another embodiment of the present disclosure. FIG. 29 corresponds to a modification of FIG. 14.

Referring to FIG. 29, the display panel 24 in accordance with this example embodiment is different from the display panel 21 in accordance with the embodiment shown in FIG. 14, in that the display panel 24 further includes a color conversion filter 160 and a wavelength conversion pattern 180.

In an embodiment, the color conversion filter 160 may be a color filter. The color filter allows light of a specific color to be selectively transmitted therethrough, and may block advancing of light of another color by absorbing the light. The light passing through the color filter may display one of primary colors of red, green, and blue. However, the color displayed by the light passing through the color filter is not limited to the primary colors, and the light may display any one of colors of cyan, magenta, yellow, and white.

Because the color filter absorbs external light to a considerable level, the color filter may decrease reflection of the external light even when a polarizing plate or the like is not additionally placed in the display panel 24.

A first capping layer 171 is on the color conversion filter 160. The first capping layer 171 may prevent the color conversion filter 160, etc. from being damaged or contaminated due to penetration of an impurity such as moisture or air from the outside. For example, the first capping layer 171 may reduce the chance of the color conversion filter 160 from being contaminated by external impurities, such as, moisture or air from the atmosphere. Also, the first capping layer 171 may prevent (or reduce the chance of) a colorant included in each color filter from being diffused into another component.

In some embodiments, the first capping layer 171 may be made of an inorganic material. For example, the first capping layer 171 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and the like.

The wavelength conversion pattern 180 is on the first capping layer 171. The wavelength conversion pattern 180 may convert incident light with a peak wavelength into light with a specific peak wavelength, and emit the converted light. Light passing through the wavelength conversion pattern 180 may display one of primary colors of red, green, and blue. However, the color displayed by the light passing through the wavelength conversion pattern 180 is not limited to the primary colors, and the light may display any one of colors of cyan, magenta, yellow, and white.

The wavelength conversion pattern 180 may overlap with the color conversion filter 160.

The wavelength conversion pattern 180 may include a base rein 181 and a wavelength conversion material 183 dispersed in the base resin 181. The wavelength conversion pattern 180 may further include a scattering material 185 dispersed in the base resin 181.

The material used in the base resin 181 is not particularly limited as long as the base resin 181 includes a material which has high light transmittance and excellent dispersion characteristic with respect to the wavelength conversion material 183 and the scattering material 185. For example, the base resin 181 may include an organic material such as epoxy-based resin, acryl-based resin, cardo-based resin, or imide-based resin.

The wavelength conversion material 183 may convert incident light with a peak wavelength into light with a specific peak wavelength. Examples of the wavelength conversion material 183 may be a quantum dot (QD), a quantum rod, a fluorescent substance, and the like.

The quantum dots may be semiconductor nanocrystalline materials. The quantum dots have a specific band gap depending on their composition and size, and may emit light having an inherent band after absorbing light. Examples of the semiconductor nanocrystals of the quantum dots may include a Group IV based nanocrystal, a Group II-VI based compound nanocrystal, a Group III-V based compound nanocrystal, a Group IV-VI based nanocrystal, or a combination thereof.

For example, the group IV based nanocrystal may include a dyadic compound such as silicon (Si), germanium (Ge), silicon carbide (SiC), and silicon-germanium (SiGe). However, the present disclosure is not limited thereto.

Further, the group II-VI compound nanocrystals may include dyadic compounds, such as CdSe, CdTe, ZnS, ZnSe, ZnTe, ZnO, HgS, HgSe, HgTe, MgSe, MgS, mixtures thereof, and/or the like; triad compounds, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, mixtures thereof, and/or the like; and tetrad compounds, such as HgZnTeS, CdZnSeS, CdZnSeTe, CdZnSTe, CdHgSeS, CdHgSeTe, CdHgSTe, HgZnSeS, HgZnSeTe, HgZnSTe, mixtures thereof, and/or the like. However, the present disclosure is not limited thereto.

In addition, the group III-V compound nanocrystals may include dyadic compounds, such as GaN, GaP, GaAs, GaSb, AlN, AlP, AlAs, AlSb, InN, InP, InAs, InSb, mixtures thereof, and/or the like; triad compounds, such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, mixtures thereof, and/or the like; or tetrad compounds, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, mixtures thereof, and/or the like. However, the present disclosure is not limited thereto.

The group IV-VI nanocrystals may include dyadic compounds, such as SnS, SnSe, SnTe, PbS, PbSe, PbTe, mixtures thereof, and/or the like; triad compounds, such as SnSeS, SnSeTe, SnSTe, PbSeS, PbSeTe, PbSTe, SnPbS, SnPbSe, SnPbTe, mixtures thereof, and/or the like; or tetrad compounds, such as SnPbSSe, SnPbSeTe, SnPbSTe, mixtures thereof, and/or the like. However, the present disclosure is not limited thereto.

The quantum dots may have a core-shell structure, which includes a core including the above-described nanocrystals and a shell surrounding the core. The shell of the quantum dots may serve as a protective layer for preventing or reducing the chemical denaturation of the core to maintain semiconductor characteristics and/or a charging layer for imparting electrophoretic characteristics to the quantum dots. The shell may be a single layer or a multi-layer structure. As an example, a metal or non-metal oxide, a semiconductor compound, a combination thereof, and/or the like may be adopted as the shell of the quantum dots.

For example, the above-described metal or nonmetal oxide may include a dyadic compound, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, and/or the like; or triad compounds, such as $MgAl_2O_4$, $CoFe_2O_4$, $NiFe_2O_4$, $CoMn_2O_4$, and/or the like. However, the present disclosure is not limited thereto.

Further, the above-described semiconductor compound may include CdS, CdSe, CdTe, ZnS, ZnSe, ZnTe, GaAs, GaP, GaSb, HgS, HgSe, HgTe, InAs, InP, InSb, AlAs, AlP, AlSb, and/or the like. However, the present disclosure is not limited thereto.

The light emitted by the wavelength conversion material 183 may have a full width of half maximum (FWHM) of the light-emitting wavelength spectrum of about 45 nm or less, about 40 nm or less, or about 30 nm or less, thereby further improving the color purity and the color reproducibility. Further, the light emitted by the first wavelength conversion material 183 may be emitted in various directions regardless of the incident angle of the incident light. Accordingly, the side visibility of the display device may be improved.

A portion of light emitted from a light emitting element LD is not converted into red light by the wavelength conversion material 183 but may be emitted by passing through the wavelength conversion pattern 180. A component which is not converted by the wavelength conversion pattern 180 but is incident into the color conversion filter 150 may be blocked by the color conversion filter 160. On the other hand, red light converted by the wavelength conversion pattern 180 may be emitted to the outside by passing through the color conversion filter 160. Accordingly, first emission light L1 emitted to the outside in a first color area LA11 may be red light.

The scattering material 185 may have a refractive index different from that of the base resin 181, and form an optical interface with the base resin 181. For example, the scattering material 185 may be a light scattering particle. The scattering material 185 is not particularly limited as long as it includes a material capable of scattering at least some of transmitted light. For example, the scattering material 185 may be a metal oxide particle or organic particle. Examples of the metal oxide may be titanium oxide (TiO2), zirconium oxide ($ZrO_2$), aluminum oxide ($Al_2O_3$), indium oxide ($In_2O_3$), zinc oxide (ZnO), tin oxide ($SnO_2$), and the like. Examples of the organic material may be acryl-based resin, urethane-based resin, and the like. The scattering material 185 may scatter light in several directions irrespective of the incident direction of incident light, without substantially converting the wavelength of the light transmitted through the wavelength conversion pattern 180. Accordingly, the path length of light transmitted through the wavelength conversion pattern 180 can be increased, and the color conversion efficiency caused by the wavelength conversion material 183 may be improved.

A second capping layer 172 may be over the wavelength conversion pattern 180. The second capping layer 172 along with the first capping layer 171 may encapsulate the wavelength conversion pattern 180, and accordingly, the wavelength conversion pattern 180 may be prevented (or substantially prevented) from being damaged (or chances of damage may be reduced) or contaminated due to penetration of an impurity such as moisture or air from the outside.

The second capping layer 172 may be made of an inorganic material. The second capping layer 172 may be made of the same material as the first capping layer 171, or include at least one of the materials mentioned in the description of the first capping layer 171.

In accordance with example embodiments of the present disclosure, a mask process may be minimized or reduced in the manufacturing process of the display device.

Further, a step difference between pads in the display device may be minimized or reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display panel comprising:
   a base layer having a display area and a non-display area, the non-display area comprising a pad area;
   a plurality of transistors on the base layer;
   a first protective layer covering the plurality of transistors;
   a conductive layer on the first protective layer;
   a second protective layer over the conductive layer;
   a first electrode and a second electrode on the second protective layer, the first and second electrodes being spaced from each other;
   a plurality of light emitting elements located between the first electrode and the second electrode;
   a first contact electrode on the first electrode, the first contact electrode being in contact with one end portion of at least one light emitting element from among the plurality of light emitting elements, and a second contact electrode on the second electrode, the second contact electrode being in contact with an other end portion of the at least one light emitting element from among the plurality of light emitting elements; and
   a first pad in the pad area, the first pad comprising a plurality of conductive pad patterns,
   wherein a pad pattern at an uppermost portion of the first pad comprises the same material as the first contact electrode or the second contact electrode.

2. The display panel of claim 1, wherein the first pad comprises:
   a first pad pattern;
   a second pad pattern on the first pad pattern;
   a third pad pattern on the second pad pattern;
   a fourth pad pattern on the third pad pattern; and
   a fifth pad pattern on the fourth pad pattern,
   wherein the fifth pad pattern is the uppermost portion of the first pad.

3. The display panel of claim 2, wherein the fourth pad pattern comprises the same material as the first electrode and the second electrode, and
   wherein the fifth pad pattern comprises the same material as the first contact electrode or the second contact electrode.

4. The display panel of claim 3, wherein the first pad pattern comprises the same material as a gate electrode of each of the transistors,
   wherein the second pad pattern comprises the same material as a source electrode and a drain electrode of each of the transistors, and
   wherein the third pad pattern comprises the same material as the conductive layer.

5. The display panel of claim 4, wherein the conductive layer comprises a connection pattern which electrically connects a source electrode or a drain electrode of a driving transistor from among the plurality of transistors to the first electrode or the second electrode.

6. The display panel of claim 3, wherein the first pad pattern, the second pad pattern, the third pad pattern, the fourth pad pattern, and the fifth pad pattern are electrically connected.

7. The display panel of claim 2, wherein the second pad pattern and the fifth pad pattern have the same width.

8. The display panel of claim 2, wherein the first pad pattern, the third pad pattern, and the fourth pad pattern have the same width.

9. The display panel of claim 1, wherein the first pad comprises a groove at an upper portion thereof, and a ratio of depth to width of the groove is 20 or more.

10. The display panel of claim 9, wherein the width of the groove is 20 μm or more, and the depth of the groove is 1 μm or less.

11. The display panel of claim 1, wherein the pad pattern at the uppermost portion of the first pad comprises ITO, IZO, or ITZO.

12. The display panel of claim 1, wherein the first pad is surrounded by adjacent insulating materials,
wherein a step difference between the first pad and the insulating materials is 0.6 μm to 2.0 μm.

13. The display panel of claim 1, further comprising a second pad in the pad area,
wherein the first pad is a gate pad and the second pad is a data pad.

14. The display panel of claim 13, wherein a scan signal is applied to the first pad from outside, and
wherein the second pad is to receive a data signal from the outside.

15. The display panel of claim 13, wherein the second pad is adjacent to the first pad, and
wherein a distance between the first pad and the second pad is 15 μm to 25 μm.

16. The display panel of claim 1, further comprising an insulating layer over the first pad, wherein the insulating layer comprises an area overlapping with an edge of the first pad.

17. The display panel of claim 16, wherein the overlapping area has a width of 2 μm to 3 μm.

18. The display panel of claim 16, wherein the insulating layer has a thickness of 6000 Å or less.

19. The display panel of claim 1, further comprising an island electrode at the same layer as the first electrode and the second electrode, wherein the island electrode is located between the first electrode and the second electrode.

20. The display panel of claim 19, wherein some of the plurality of light emitting elements are located between the first electrode and the island electrode, and wherein other ones of the light emitting elements of the plurality of light emitting elements are located between the island electrode and the second electrode.

21. The display panel of claim 20, wherein the plurality of light emitting elements are connected in series and/or in parallel.

22. The display panel of claim 1, wherein the first contact electrode is on the second contact electrode.

23. The display panel of claim 1, wherein each of the light emitting elements comprises:
the one end portion including an n-type semiconductor material;
the other end portion including a p-type semiconductor material; and
an active layer located in a quantum well structure between the one end portion and the other end portion,
wherein the light emitting element has a diameter and a length in a range of a few hundreds of nano scales to a few micro scales.

24. A display device comprising:
a display panel having a plurality of pixels arranged therein;
a scan driver configured to supply a scan signal to each of the plurality of pixels; and
a data driver configured to supply a data signal to each of the plurality of pixels,
wherein the display panel comprises:
a base layer having a display area and a non-display area, the non-display area comprising a pad area;
a plurality of transistors on the base layer, the plurality of transistors being included in each of the pixels;
a first protective layer covering the plurality of transistors;
a conductive layer on the first protective layer;
a second protective layer over the conductive layer;
a first electrode and a second electrode on the second protective layer, the first and second electrodes being spaced from each other;
a plurality of light emitting elements located between the first electrode and the second electrode;
a first contact electrode on the first electrode, the first contact electrode being in contact with one end portion of at least one light emitting element from among the plurality of light emitting elements, and a second contact electrode on the second electrode, the second contact electrode being in contact with an other end portion of the at least one light emitting element; and
first and second pads in the pad area, the first and second pads having a plurality of conductive pad patterns,
wherein the first pad is electrically connected to the scan driver,
wherein the second pad is electrically connected to the data driver,
wherein a pad pattern at an uppermost portion of each of the first pad and the second pad comprises the same material as the first contact electrode or the second contact electrode.

25. The display device of claim 24, wherein the scan driver and the data driver are located outside of the display panel.

26. The display device of claim 24, wherein each of the pixels comprises seven transistors.

* * * * *